(12) United States Patent
Ohmaru et al.

(10) Patent No.: US 9,190,172 B2
(45) Date of Patent: Nov. 17, 2015

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Takuro Ohmaru, Kanagawa (JP); Naoaki Tsutsui, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 14/157,574

(22) Filed: Jan. 17, 2014

(65) Prior Publication Data

US 2014/0204645 A1    Jul. 24, 2014

(30) Foreign Application Priority Data

Jan. 24, 2013  (JP) ................. 2013-010792

(51) Int. Cl.
  *G11C 8/16*  (2006.01)
  *G11C 29/00*  (2006.01)
  *G01R 31/3185*  (2006.01)

(52) U.S. Cl.
  CPC ........ *G11C 29/00* (2013.01); *G01R 31/318597* (2013.01)

(58) Field of Classification Search
  CPC ..................... G11C 5/06; G11C 8/16
  USPC ................................ 365/72, 189.04
  See application file for complete search history.

(56) References Cited

U.S. PATENT DOCUMENTS

| | | | |
|---|---|---|---|
| 5,047,710 A * | 9/1991 | Mahoney ................. | 324/537 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Michael Tran
(74) *Attorney, Agent, or Firm* — Nixon Peabody LLP; Jeffrey L. Costellia

(57) ABSTRACT

To supply a signal in which the occurrence of delays is prevented to a storage circuit. To provide a novel semiconductor device in which a load applied to a logic circuit is low. The following structure is completed: a storage circuit to which a plurality of data signals and a selection signal are supplied connects two combination circuits, and a storage circuit has a function of selecting one of a plurality of data signals in accordance with the selection signal. A selection circuit is not necessarily provided between the storage circuit and the combination circuit. As a result, the combination circuit can supply a signal in which the occurrence of delays is prevented to the storage circuit.

15 Claims, 11 Drawing Sheets

(56) References Cited

U.S. PATENT DOCUMENTS

| | | | |
|---|---|---|---|
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,269,780 | B2 | 9/2007 | Arima et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,488,394 | B2 | 7/2013 | Nagatsuka et al. |
| 8,508,256 | B2 | 8/2013 | Yakubo et al. |
| 8,575,985 | B2 | 11/2013 | Ohmaru et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0083773 | A1* | 4/2007 | Peeters et al. .................. 713/300 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0102524 | A1* | 4/2009 | Ide et al. ....................... 327/153 |
| 2009/0114910 | A1 | 5/2009 | Chang |
| 2009/0129173 | A1* | 5/2009 | Kajiyama et al. ........ 365/189.05 |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2012/0287099 | A1 | 11/2012 | Toyotaka |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2013-009297 | 1/2013 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000°C", Journal of Solid State Chemistry, 1985, vol. 60, pp. 382-384.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No, 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl, Phys. Lett. (Applied Physics Letters) , Jun. 17, 1996, vol. 68, No. 25, pp. 3650-3652.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZNO TFTS) for AMLCDS", Journal of the SID, 2007, vol. 15, No. 1, pp. 17-22.
Park.S et al., "Challenge to Future Displays: Transparent AM-OLED Driven by Peald Grown ZNO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M. "Suftla Flexible Microelectronics on Their Way to Business", SID Digest '07 : SID International Symposium Digest of Technical Papers, 2007, vol. 38, pp. 1673-1676.
Kurokawa.Y et at, "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al.. "World'S Largest (15-Inch) XGA AMLCD Panel Using Igzo Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of Igzo Transparent Amorphous Oxide Semiconductor", IDW '08 : Proceedings of the 15TH International Display Workshops, Dec. 3, 2008, pp. 1637-1640.
Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.
Ohara.H et al., "21.3:4.0 IN. QVGA AMOLED Display Using In-Ga-Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Osada.T et al., "Development of Driver-Integrated Panel Using Amorphous In-Ga-Zn-Oxide TFT", AM-FPD '09 Digest of Technical Papers, Jul. 1, 2009, pp. 33-36.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al. "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):a Zn4s conductor", Philosophical Magazine, 2001, vol. 81, No. 5, pp. 501-515.
Janottla et al., "Oxygen Vacancies in ZnO", Appl. Phys. Lett. (Applied Physics Letters) , 2005, vol. 87, pp. 122102-1-122102-3.
Clarks et al., "First Principles Methods Using Castep", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al.. "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In-Ga-Zn-O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous Gizo (Ga2O3-In2O3-ZnO) TFT", SID Digest '08 : SID International. Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Orm et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor device, a display device, a light-emitting device, a power storage device, a driving method thereof, or a manufacturing method thereof. In particular, the present invention relates to a semiconductor device. In particular, the present invention relates to a semiconductor device including a logic circuit in which a scan test can be carried out.

2. Description of the Related Art

A memory in which data stored in the first storage circuit corresponding to a volatile memory can be held by the first capacitor provided in the second storage circuit in a period during which the power supply voltage is not supplied to the storage element is known. By using a transistor whose channel is formed in an oxide semiconductor layer, a signal held in the first capacitor is held for a long time. The storage element can accordingly hold the stored content (data) also in a period during which the supply of the power supply voltage is stopped. A signal held in the first capacitor is converted into the state of a second transistor (an on state or an off state) and read from the second storage circuit; therefore, an original signal can be accurately read.

REFERENCE

[Patent Document] Japanese Published Patent Application No. 2013-9297

SUMMARY OF THE INVENTION

The larger a logic circuit including a plurality of combination circuits becomes, the more difficult verification of the operation of the logic circuit becomes.

One of methods for verifying the operation of a combination circuit in a logic circuit is a scan test. A scan test is a method using a flip flop circuit (also referred to as FF circuit) which connects combination circuits.

To carry out a scan test, a multiplexer (MUX) needs to be provided between a combination circuit and a FF circuit. FIG. 9 illustrates one example of the structure of a logic circuit in which a scan test is carried out.

In a logic circuit 50, a multiplexer 51 is provided between a combination circuit Comb C2 and the FF circuit 52. A signal supplied from the combination circuit Comb C2 in the previous stage, a signal (SIn) supplied from a scan-in terminal, or a scan enable signal (SE) is supplied to the multiplexer 51.

In the structure, one of a signal supplied from a combination circuit in the previous stage and a signal (SIn) supplied from a scan-in terminal is selected in accordance with a scan enable signal (SE) to be output to a FF circuit.

With the use of a scan enable signal (SE), FF circuits are connected in series by multiplexers so that a shift register (also referred to as scan chain) can be formed. A scan-in signal (SIn) which is serially input and includes an initial value of a scan test is supplied to the formed shift register from the scan-in terminal, so that the initial value can be set in each of the FF circuits.

Note that a circuit including the multiplexer 51 and the FF circuit 52 (see FIG. 9) which form a scan chain is referred to as scan flip flop 55 (also referred to as scan FF).

A scan test includes four steps. A first step is to set an initial value to each scan FF. A second step is to supply the initial value to each combination circuits. A third step is to supply the result of an arithmetic operation in each combination circuit to each scan FF. A fourth step is to correct a signal supplied from each combination circuit from the end terminal of a scan chain by shifting the scan chain. Note that analysis of a signal supplied to the end terminal (SOUT) leads to verification of the operation of a plurality of combination circuits.

However, the multiplexer provided between the combination circuit and the FF circuit possibly becomes a load in transmitting a signal, so that signal delay and the like occur in some cases. This may result in a setup time error, for example. Further, since operation frequency needs to be lowered, the performance of the logic circuit is not able to be shown sufficiently in some cases.

One embodiment of the present invention is made in view of the foregoing technical background. It is an object to provide a novel semiconductor device in which a load applied to a logic circuit is low. Another object of one embodiment of the present invention is to provide a semiconductor device or the like in which a large amount of current is prevented from flowing through wirings. Another object of one embodiment of the present invention is to provide a semiconductor device or the like in which possibility of its breakage is low. Another object of one embodiment of the present invention is to provide a semiconductor device or the like in which possibility that shoot-through current flows is low. Another object of one embodiment of the present invention is to provide a semiconductor device or the like with low off-state current. Another object of one embodiment of the present invention is to provide a semiconductor device or the like with low power consumption. Another object of one embodiment of the present invention is to provide an eye-friendly display device or the like. Another object of one embodiment of the present invention is to provide a semiconductor device or the like using a transparent semiconductor layer. Another object of one embodiment of the present invention is to provide a semiconductor device or the like using a semiconductor layer with high reliability. Another object of one embodiment of the present invention is to provide a novel semiconductor device. Another object of one embodiment of the present invention is to provide a favorable semiconductor device or the like.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device which includes a first combination circuit, a first storage circuit which can supply a first data signal to the first combination circuit, a second storage circuit which can supply a second data signal to the first combination circuit, a selection signal line capable of supplying a selection signal to the first storage circuit and the second storage circuit, and a second combination circuit which can supply the first data signal to the first storage circuit and can supply the second data signal to the second storage circuit. The second storage circuit has a function of selecting a first state in which a signal supplied from the second combination circuit is selected and a second state in which a signal supplied from the first storage circuit is selected, in accordance with the selection signal.

One embodiment of the present invention may be the semiconductor device in which the second storage circuit includes a first storage portion to which the second data signal is supplied; a selection unit to which a signal is supplied from each of the first storage portion, the first storage circuit, and the selection signal line; and a second storage portion to which a signal selected by the selection unit is supplied and which supplies a signal to the first combination circuit. The selection unit selects a signal supplied from the first storage portion in the first state and selects a signal supplied from the first storage circuit in the second state.

The semiconductor device of one embodiment of the present invention includes a structure in which a second combination circuit can supply a data signal and the first storage circuit can supply a signal (e.g., a scan-in signal) to a second storage circuit. The second storage circuit selects a supplied signal and can supply the signal to the circuit in the next stage. Accordingly, a selection circuit is not necessarily provided between the second storage circuit and the second combination circuit. As a result, a novel semiconductor device in which the second combination circuit can supply a signal in which the occurrence of delays is prevented to the second storage circuit, and a load applied to a logic circuit is low can be provided.

One embodiment of the present invention is a semiconductor device includes a first combination circuit, a first storage circuit which can supply a first data signal to the first combination circuit, a second storage circuit which can supply a second data signal to the first combination circuit, a first selection signal line capable of supplying a first selection signal to the first storage circuit and the second storage circuit, a selection circuit which can select a signal supplied to the second storage circuit, a secondary storage circuit which can supply a third data signal to the selection circuit, a second selection signal line capable of supplying a second selection signal for controlling the selection circuit, and a second combination circuit which can supply the first data signal to the first storage circuit and can supply the second data signal to the second storage circuit. The second storage circuit has a function of selecting a first state in which a signal supplied from the second combination circuit is selected and a second state in which a signal supplied from the first storage circuit is selected, in accordance with the selection signal. The selection circuit has a function of selecting a state in which a signal which the secondary storage circuit supplies is supplied and a state in which a signal the first storage circuit supplies is supplied, in accordance with the second selection signal.

One embodiment of the present invention may be the semiconductor device in which the second storage circuit includes a first storage portion to which the second data signal is supplied; a selection unit to which a signal is supplied from each of the first storage portion, the selection circuit, and the first selection signal line; and a second storage portion to which a signal selected by the selection unit is supplied and which supplies a signal to the first combination circuit. The selection unit selects a signal supplied from the first storage portion in the first state and selects a signal supplied from the selection circuit in the second state.

The semiconductor device of one embodiment of the present invention includes a structure in which a second combination circuit can supply a data signal or a signal selected by a selection circuit (e.g., a scan-in signal or a signal supplied from the secondary storage circuit) to a second storage circuit. The second storage circuit can select a signal supplied thereto and supply the signal to the circuit in the next stage. Accordingly, a selection circuit is not necessarily provided between the second storage circuit and the second combination circuit. The third data can be transferred from the secondary storage circuit to the second storage circuit at high speed. As a result, a novel semiconductor device in which the second combination circuit can supply a signal in which the occurrence of delays is prevented to the second storage circuit, and a load applied to a logic circuit is low can be provided.

One embodiment of the present invention may be the semiconductor device in which the second storage circuit includes a first storage portion to which a second data signal is supplied; a selection unit to which a signal is supplied from each of the first storage portions, the selection circuit, and the first selection signal line; and a second storage portion to which a signal selected by the selection unit is supplied and which supplies a signal to the first combination circuit. The secondary storage circuit has a function of storing a signal supplied to the second storage circuit. The selection unit selects a signal supplied from the first storage portion in the first state and selects a signal supplied from the selection circuit in the second state.

The semiconductor device of one embodiment of the present invention includes a structure in which a signal of the second storage circuit can be saved in the secondary storage circuit. The semiconductor device includes a structure in which the selection circuit selects the signal saved in the secondary storage circuit and supplies the signal to the second storage circuit. With the operation, a first operation state of the semiconductor device can be stored in the secondary storage circuit. By inputting the first operation state to the secondary storage circuit after the semiconductor device performs another operation, the semiconductor device can be quickly returned to the first operation state. Further, the selection circuit is not necessarily provided between the second storage circuit and the second combination circuit. As a result, a novel semiconductor device in which the second combination circuit can supply a signal in which the occurrence of delays is prevented to the second storage circuit, and a load applied to a logic circuit is low can be provided.

One embodiment of the present invention may be the semiconductor device in which the second storage circuit includes a first storage portion to which a second data signal is supplied; a selection unit to which a signal is supplied from each of the first storage portions, the selection circuit, and the first selection signal line; and a second storage portion to which a signal selected by the selection unit is supplied and which supplies a signal to the first combination circuit. The secondary storage circuit includes a first transistor including a gate electrode to which a first control signal is supplied, a first electrode to which a signal of the second storage circuit is supplied, and an oxide semiconductor layer in which a channel is formed; a first capacitor including a first electrode electrically connected to a second electrode of the first transistor and a second electrode to which a low power supply potential is supplied; a second transistor including a gate electrode electrically connected to the second electrode of the first transistor and a first electrode electrically connected to the second electrode of the first capacitor; a third transistor including a first electrode electrically connected to a second electrode of the second transistor and a gate electrode to which a second control signal is supplied; a fourth transistor including a first electrode electrically connected to a second electrode of the third transistor, a gate electrode electrically connected to the gate electrode of the third transistor, and a second electrode to which a high power supply potential is supplied; a second capacitor including a first electrode electrically connected to the first electrode of the fourth transistor and a second electrode electrically connected to the first electrode of the second transistor; and a signal terminal electrically connected to the first electrode of the second capacitor. The selection unit selects a signal supplied from the first storage portion in the first state and selects a signal supplied from the selection circuit in the second state.

In this specification, one of a first electrode and a second electrode of a transistor refers to a source electrode and the other refers to a drain electrode.

According to one embodiment of the present invention, a novel semiconductor device in which a load applied to a logic circuit is low can be provided.

DETAILED DESCRIPTION OF THE INVENTION

Figure 1A:
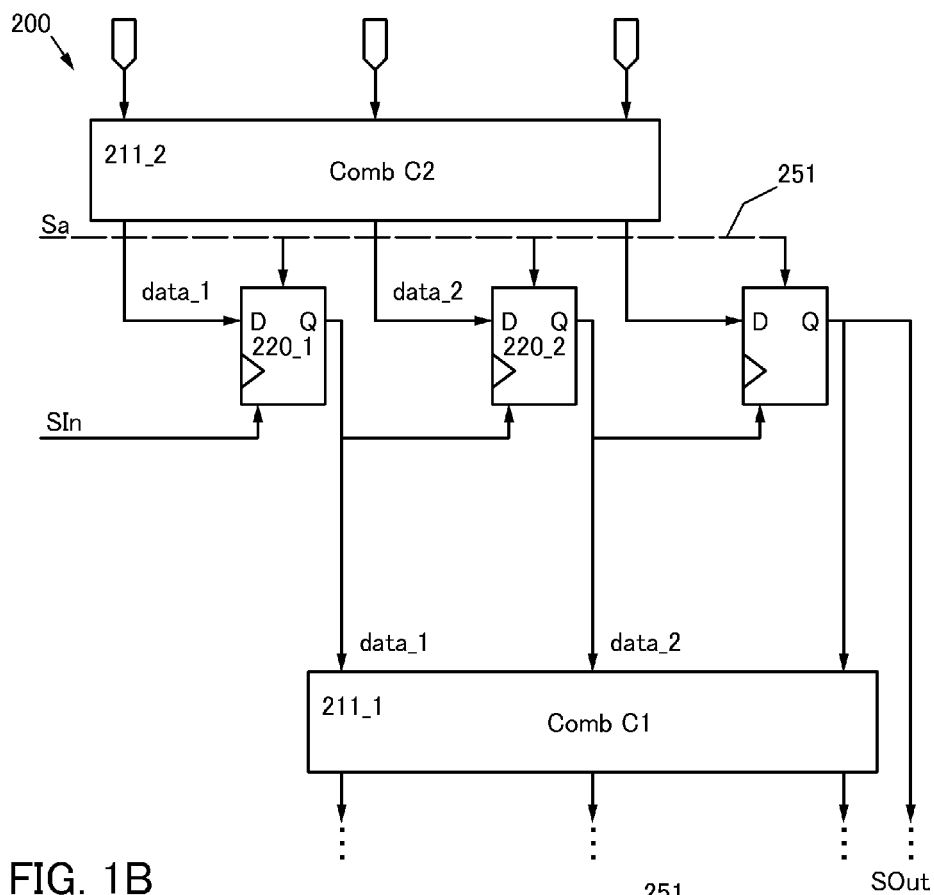
FIGS. 1A and 1B are block diagrams each illustrating the structure of a semiconductor device of an embodiment.

To solve the above problems, one embodiment of the present invention focuses on a combination circuit, a flip flop circuit which connects combination circuits, and a multiplexer which is provided between the combination circuit and the flip flop circuit. The embodiments described below include one embodiment of the present invention which is created on the basis of the structure of a storage circuit which connects combination circuits.

A semiconductor device of one embodiment of the present invention includes a structure in which a storage circuit to which a plurality of data signals and a selection signal are supplied connects two combination circuits. The storage circuit has a function of selecting one of a plurality of data signals in accordance with the selection signal.

In the semiconductor device of one embodiment of the present invention, a selection circuit is not necessarily provided between a second storage circuit and a second combination circuit. As a result, a novel semiconductor device in which the second combination circuit can supply a signal in which the occurrence of delays is prevented to the second storage circuit, and a load applied to a logic circuit is low can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, the structure of a semiconductor device of one embodiment of the present invention will be described with reference to FIGS. 1A and 1B and FIGS. 2A and 2B.

Figure 1B:
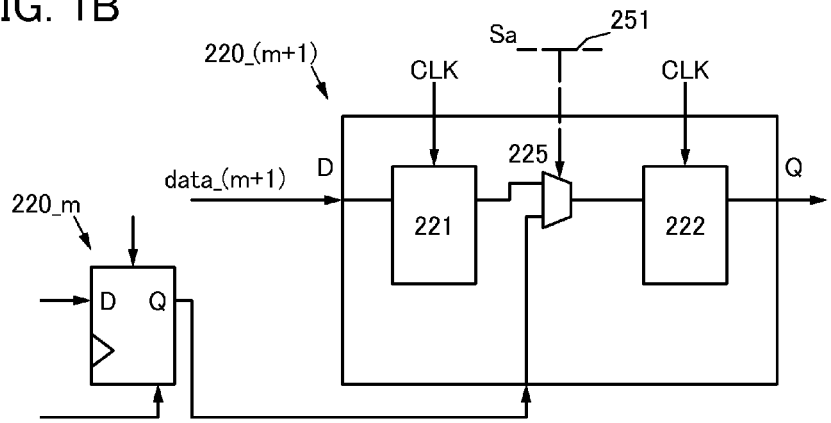

FIG. 1A is a block diagram illustrating the structure of a semiconductor device of one embodiment of the present invention. FIG. 1B a block diagram illustrating the structure of the second storage circuit included in the semiconductor device of one embodiment of the present invention.

A semiconductor device 200 described in this embodiment as an example includes a plurality of storage circuits. Note that for convenience of description, FIG. 1A shows a first storage circuit 220_1 and a second storage circuit 220_2 with their reference number and does not show the other storage circuits.

FIG. 1A shows a selection signal Sa, a scan-in signal SIn, the scan-out signal SOut, and the clock signal CLK.

The semiconductor device 200 described in this embodiment as an example includes the first combination circuit 211_1, the first storage circuit 220_1 which can supply a first data signal data_1 to the first combination circuit 211_1, and the second storage circuit 220_2 which can supply a second data signal data_2 to the first combination circuit 211_1 (see FIG. 1A).

The semiconductor device 200 also includes a selection signal line 251 capable of supplying the selection signal Sa which determines the states of the first storage circuit 220_1 and the second storage circuit 220_2 (a first state (S1) or a second state (S2)).

The semiconductor device 200 also includes a second combination circuit 211_2 which can supply the first data signal data_1 to the first storage circuit 220_1 in the first state (S1) and can supply the second data signal data_2 to the second storage circuit 220_2 in the first state (S1).

The second storage circuit 220_2 has a function of selecting the first state (S1) in which the second data signal data_2 which is supplied from the second combination circuit 211_2 is selected and the second state (S2) in which a signal (e.g., the first data signal data_1) which is supplied from the first storage circuit 220_1 is selected in accordance with the selection signal Sa.

FIG. 1B is a block diagram illustrating the structure of the storage circuit in detail. For the description, only m-th and (m+1)th storage circuits are illustrated. Here, assuming that the number of storage circuits which can be connected and provided in the semiconductor device 200 is n, m is an integer of one or more and (n−1) or less.

A storage circuit 220_(m+1) includes a first storage portion 221 to which the data signal data_(m+1) is supplied and a selection unit 225 to which signals are supplied from the first storage portion 221, the storage circuit 220_m, and the selection signal line 251.

A second storage portion 222 is supplied with a signal selected by the selection unit 225, and supplies the signal to the first combination circuit 211_1.

Note that in the storage circuit 220_(m+1) in the first state (S1), the selection unit 225 selects a signal supplied from the first storage portion 221 and supplies the signal to the second storage portion 222.

Further, in the storage circuit 220_(m+1) in the second state (S2), the selection unit 225 selects a signal supplied from the storage circuit 220_m.

In other words, the state in which to the second storage portion 222, the selection unit 225 supplies a signal supplied from the first storage portion 221 corresponds to the first state. In addition, the state in which to the second storage portion 222, the selection unit 225 supplies a signal supplied from the storage circuit 220_m corresponds to the second state.

The semiconductor device 200 of one embodiment of the present invention includes a structure in which the second combination circuit 211_2 can supply a data signal (e.g., the second data signal data_2) to the second storage circuit 220_2, and the first storage circuit 220_1 can supply a signal (e.g., a scan-in signal) to the second storage circuit. The second storage circuit 220_2 can select one of the supplied signals and can supply the signal to the circuit in the next stage.

Accordingly, a selection circuit is not necessarily provided between a storage circuit and a combination circuit (e.g., between the second storage circuit 220_2 and the second combination circuit 211_2). As a result, a novel semiconductor device 200 in which the combination circuit can supply a data signal in which the occurrence of delays is prevented to the storage circuit, and a load applied to a logic circuit is low can be provided.

The semiconductor device 200 described in this embodiment as an example supplies a selection signal for setting the state to the second state (S2) to each storage circuit, so that the m-th storage circuit and the (m+1)th storage circuit are connected in series to form a shift register. Accordingly, a serial scan-in signal SIn generated to include an initial value of a scan test can be supplied from the first storage circuit 220_1 in the second state (S2) to each storage circuit.

Then, a selection signal for setting the state to the first state (S1) is supplied to each storage circuit, so that a scan-in signal can be supplied from each storage circuit to the combination circuit.

After a scan test is carried out, a selection signal for setting the state to the second state (S2) is supplied to each storage circuit again, so that a shift register can be formed. Accordingly, a serial scan-out signal (SOut) including the results of the scan test can be collected from the n-th storage circuit in the second state (S2).

<Structural Example of Storage Circuit>

The structure of the storage circuit 220_(m+1) which can be used in the semiconductor device 200 of one embodiment of the present invention will be described below.

Figure 2A:
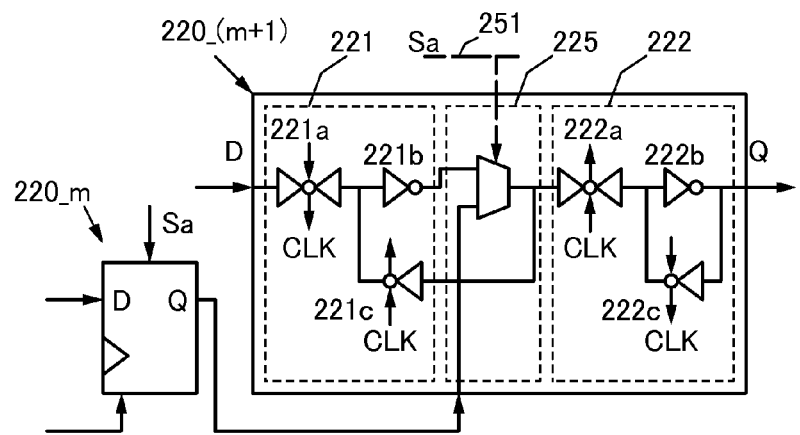
FIG. 2A is a circuit diagram illustrating the structure of a storage circuit of an embodiment and FIG. 2B is a timing diagram showing operation of the storage circuit.

FIG. 2A is a circuit diagram illustrating an example of a storage circuit which can be used in a semiconductor device of one embodiment of the present invention.

The storage circuit 220_(m+1) includes the first storage portion 221, the second storage portion 222, and the selection unit 225. A latch circuit controlled by a clock signal can be used for the first storage portion 221 and the second storage portion 222.

The first storage portion 221 includes a transmission gate 221a, an inverter 221b, and a clocked inverter 221c. The second storage portion 222 includes a transmission gate 222a, an inverter 222b, and a clocked inverter 222c. The selection unit 225 can be a multiplexer, for example.

A selection signal for setting the state to the second state (S2) is supplied to each storage circuit, so that the m-th storage circuit and the (m+1)th storage circuit are connected in series to form a shift register. In the structure illustrated in FIG. 2A, a signal which is supplied from the m-th storage circuit 220_m is supplied to the second storage portion 222 in the (m+1)th storage circuit 220_(m+1). It is to be noted that the second storage portion 222 in the (m+1)th storage circuit 220_(m+1) inverts a signal which is supplied thereto and outputs the inverted signal to a Q terminal.

To avoid it, an inverter for inverting a signal which is supplied from the m-th storage circuit 220_m in advance may be provided between the Q terminal and the multiplexer in the m-th storage circuit (e.g., in the selection unit 225).

<Example of Operation of Storage Circuit>

Figure 2B:
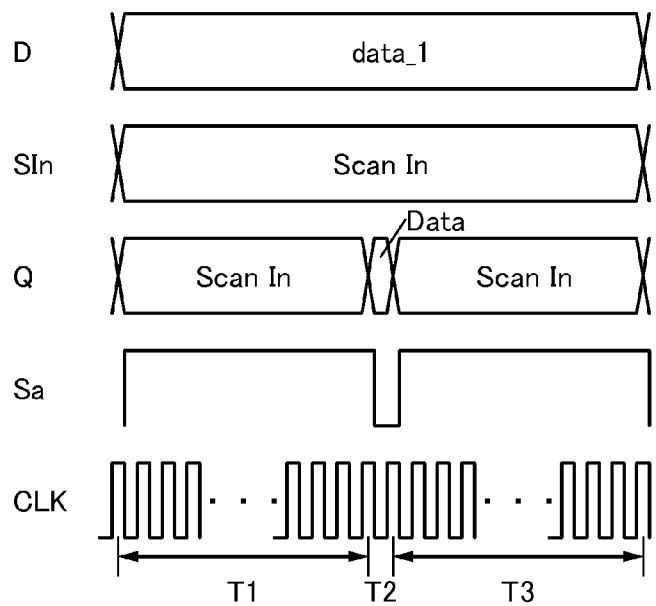

An example of an operation of the first storage circuit 220_1 will be described with reference to FIG. 2B below. FIG. 2B is a timing diagram showing the operation of the first storage circuit 220_1.

In FIG. 2B, D is the first data signal data_1 which is supplied to a D terminal of the first storage circuit 220_1. Q is a signal which is supplied from the Q terminal of the first storage circuit 220_1. SIn is the scan-in signal SIn which is supplied to the first storage circuit 220_1. CLK is the clock signal CLK which is supplied to the first storage circuit 220_1.

Sa is the selection signal Sa which is supplied to the first storage circuit 220_1. The selection signal Sa is high in a first period T1 and a third period T3 and is low in a second period T2.

The first storage circuit 220_1 is set in the second state (S2) in a period in which the selection signal Sa is high (in the period T1 and the period T3). As a result, the scan-in signal SIn is output to the Q terminal.

The first storage circuit 220_1 is set in the first state (S1) in the period T2 in which the selection signal Sa is low. As a result, the first data signal data_1 is output to the Q terminal.

Note that this embodiment can be combined with any of the other embodiments in this specification as appropriate.

Embodiment 2

In this embodiment, the structure of a semiconductor device of one embodiment of the present invention will be described with reference to FIGS. 3A and 3B and FIG. 4.

Figure 3A:
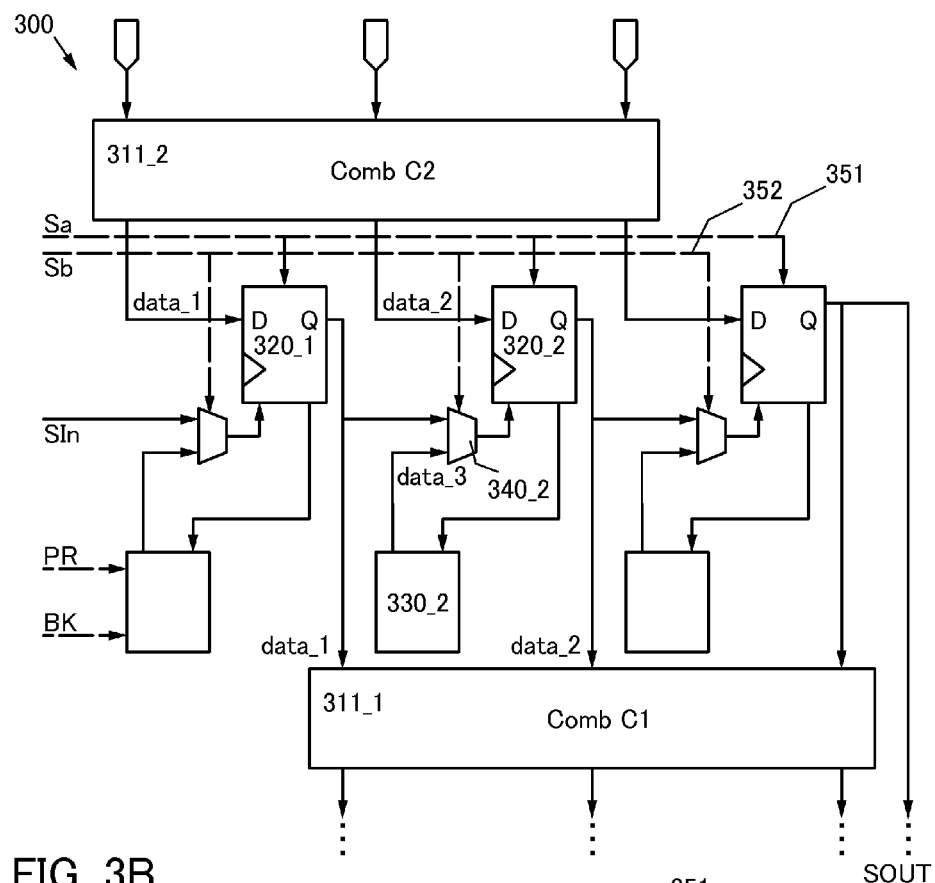
FIGS. 3A and 3B are block diagrams each illustrating the structure of a semiconductor device of an embodiment.

FIG. 3A is a block diagram illustrating the structure of a semiconductor device of one embodiment of the present invention. FIG. 3B is a block diagram illustrating the structure of the second storage circuit included in the semiconductor device of one embodiment of the present invention.

A semiconductor device 300 described in this embodiment as an example includes a plurality of storage circuits. Note that for convenience of description, FIG. 3A shows a first storage circuit 320_1 and a second storage circuit 320_2 with their reference number and does not show the other storage circuits.

FIG. 3A shows a first selection signal Sa, a second selection signal Sb, the scan-in signal SIn, the scan-out signal SOut, and the clock signal CLK. FIG. 3A also shows a first control signal BK and a second control signal PR. A signal the same as the second selection signal Sb can be used as the second control signal PR.

The semiconductor device 300 described in this embodiment as an example includes the first combination circuit 311_1, the first storage circuit 320_1 which can supply a first data signal data_1 to the first combination circuit 311_1, and the second storage circuit 320_2 which can supply a second data signal data_2 to the first combination circuit 311_1 (see FIG. 3A).

The semiconductor device 300 includes a first selection signal line 351 capable of supplying the first selection signal Sa to the first storage circuit 320_1 and the second storage circuit 320_2.

The semiconductor device 300 includes a selection circuit 340_2 which can select a signal which is supplied to the second storage circuit 320_2 and a secondary storage circuit 330_2 which can supply a third data signal data_3 to the selection circuit 340_2.

The semiconductor device 300 includes a second selection signal line 352 capable of supplying the second selection signal Sb for controlling the selection circuit 340_2.

The semiconductor device 300 also includes a second combination circuit 3112 which can supply the first data signal data_1 to the first storage circuit 320_1 and can supply the second data signal data_2 to the second storage circuit 320_2.

The second storage circuit 320_2 has a function of selecting the first state (S1) in which the second data signal data_2 which is supplied from the second combination circuit 311_2 is selected and the second state (S2) in which a signal (e.g., the first data signal data_1) which is supplied from the first storage circuit 320_1 is selected in accordance with the first selection signal Sa.

The selection circuit 340_2 has a function of selecting a state in which a signal which is supplied from the secondary storage circuit 330_2 is supplied and a state in which supplying a signal which is supplied from the first storage circuit 320_1 is supplied, in accordance with the second selection signal.

Figure 3B:
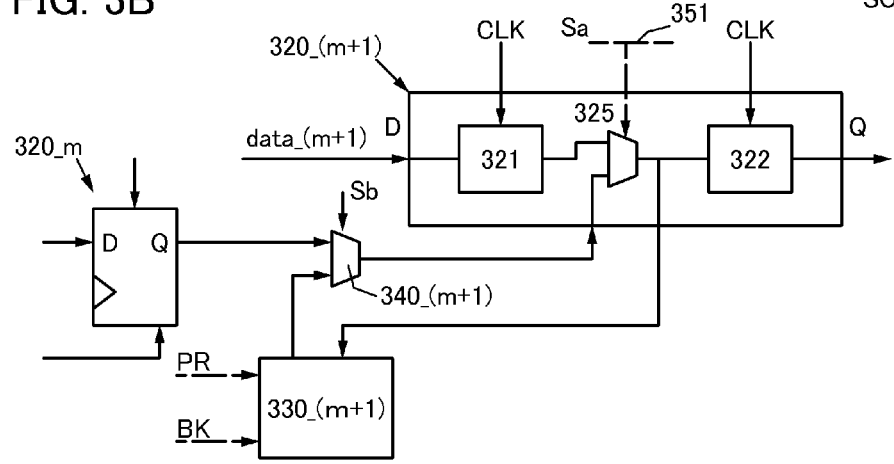

FIG. 3B illustrates a block diagram of the structure of the storage circuit in detail. For the description, only m-th and (m+1)th storage circuits are illustrated. Here, assuming that the number of storage circuits which can be connected and provided in the semiconductor device 300 is n, m is an integer of one or more and (n−1) or less.

A storage circuit 320_(m+1) includes a first storage portion 321 to which the data signal data_(m+1) is supplied and a selection unit 325 to which signals are supplied from the first storage portion 321, a selection circuit 340_(m+1), and the first selection signal line 351.

A second storage portion 322 is supplied with a signal selected by the selection unit 325, and supplies the signal to the first combination circuit 311_1.

Note that in the storage circuit 320_(m+1) in the first state (S1), the selection unit 325 selects a signal supplied from the first storage portion 321 and supplies the signal to the second storage portion 322.

Further, in the semiconductor device, the selection unit 325 selects a signal supplied from the selection circuit 340_(m+1) in the storage circuit 320_(m+1) in the second state (S2).

In other words, the state in which to the second storage portion 322, the selection unit 325 supplies a signal supplied to the first storage portion 321 corresponds to the first state. In addition, the state in which to the second storage portion 322, the selection unit 325 supplies a signal supplied to the selection circuit 340_(m+1) corresponds to the second state.

The semiconductor device 300 of one embodiment of the present invention has the structure in which to the second storage circuit 320_2, the second combination circuit 311_2 can supply a data signal (e.g., the first data signal data_1 or the second data signal data_2) or a signal (e.g., the scan-in signal SIn or a signal which is supplied to the secondary storage circuit 330) which is selected by a selection circuit (e.g., the selection circuit 340_2). The second storage circuit 320_2 can select a signal supplied thereto and supply the selected signal to the circuit in the next stage.

Accordingly, a selection circuit is not necessarily provided between a storage circuit and a combination circuit (e.g., between the second storage circuit 320_2 and the second combination circuit 311_2). In addition, the third data signal data_3 can be transferred from the secondary storage circuit 330_2 to the second storage circuit 320_2 at high speed. As a result, a novel semiconductor device 300 in which the second combination circuit 311_2 can supply a signal in which the occurrence of delays is prevented to the second storage circuit 320_2, and a load applied to a logic circuit is low can be provided.

The storage circuit 320_(m+1) includes the first storage portion 321 to which a data signal data_(m+1) is supplied and the selection unit 325 to which signals are supplied from the first storage portion 321, the selection circuit 340_(m+1), and the first selection signal line 351.

The second storage portion 322 is supplied with a signal selected by the selection unit 325, and supplies the signal to the first combination circuit 311_1.

The secondary storage circuit 330_(m+1) can store a signal which is supplied to the second storage circuit (e.g., a signal which is supplied to the first storage portion 321).

Note that in the storage circuit 320_(m+1) in the first state (S1), the selection unit 325 selects a signal supplied from the first storage portion 321 and supplies the signal to the second storage portion 322.

Further, in the semiconductor device, the selection unit 325 selects a signal supplied from the selection circuit 340_(m+1) in the storage circuit 320_(m+1) in the second state (S2).

In other words, the state in which to the second storage portion 322, the selection unit 325 supplies a signal supplied to the first storage portion 321 corresponds to the first state. In addition, the state in which to the second storage portion 322, the selection unit 325 supplies a signal supplied to the selection circuit 340_(m+1) corresponds to the second state.

The semiconductor device 300 of one embodiment of the present invention includes a structure in which a signal of the second storage circuit 320_2 can be saved in the secondary storage circuit 330_2. The semiconductor device 300 includes a structure in which the selection circuit 340_2 selects the signal saved in the secondary storage circuit 330_2 and supplies the signal to the second storage circuit 320_2. With the operation, a first operation state of the semiconductor device 300 can be stored in the secondary storage circuit. By inputting the first operation state to the secondary storage circuit after the semiconductor device 300 performs another operation, the semiconductor device 300 can be quickly returned to the first operation state (also referred to as recovery). Further, the selection circuit is not necessarily provided between the second storage circuit and the second combination circuit 311_2. As a result, a novel semiconductor device in which the second combination circuit 311_2 can supply a signal in which the occurrence of delays is prevented to the second storage circuit, and a load applied to a logic circuit is low can be provided.

The semiconductor device 300 of one embodiment of the present invention includes not only a signal line capable of supplying a signal from the second combination circuit to the second storage circuit, but also a signal line capable of inputting the first operation state stored in the secondary storage circuit to the second storage circuit. The signal line capable of inputting the first operation state stored in the secondary storage circuit to the second storage circuit can be used to form a scan chain. Accordingly, a semiconductor device in which a scan test can be carried out without providing a multiplexer to the signal line capable of supplying a signal from the second combination circuit to the second storage circuit can be provided.

<Structural Example of Storage Circuit>

The structure of the storage circuit 320_(m+1) which can be used in the semiconductor device 300 of one embodiment of the present invention will be described below.

Figure 4:
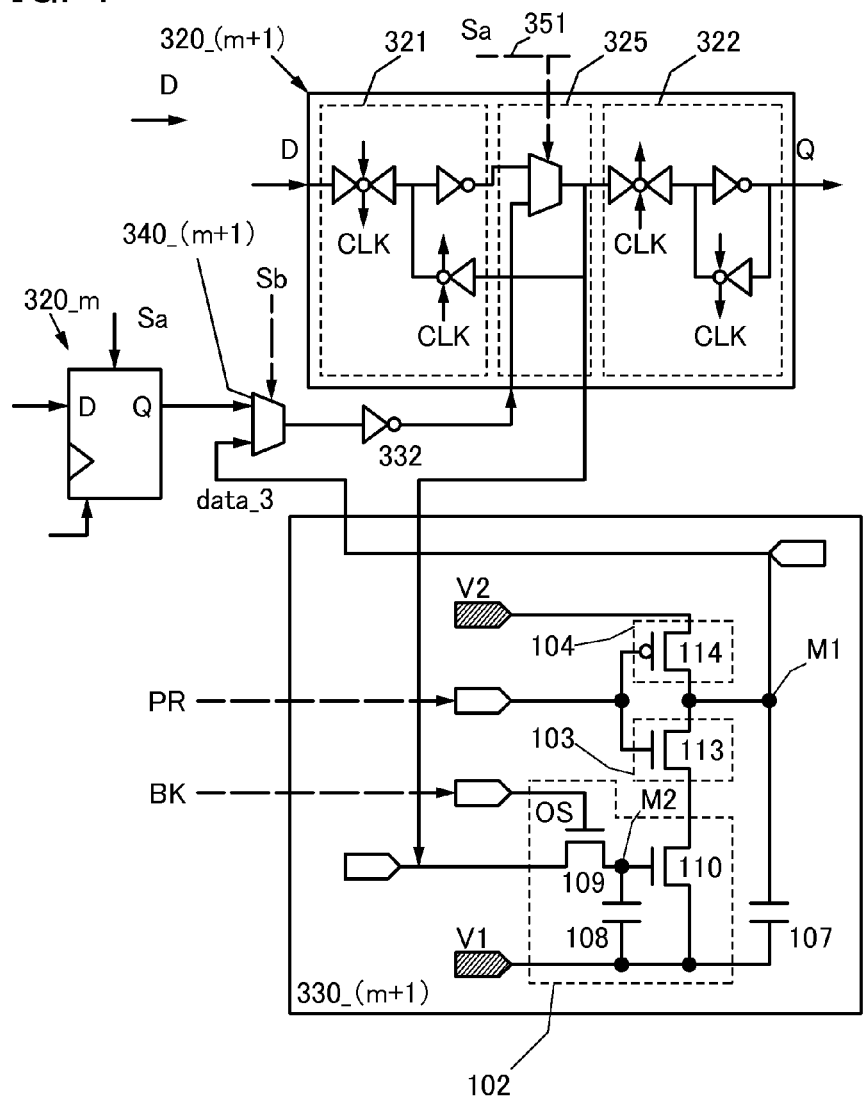
FIG. 4 is a block diagram illustrating a storage circuit of an embodiment.

FIG. 4 is a circuit diagram illustrating examples of the storage circuit 320_(m+1) and the secondary storage circuit 330_(m+1) which can be used in a semiconductor device of one embodiment of the present invention.

The storage circuit 320_(m+1) includes the first storage portion 321, the second storage portion 322, and the selection unit 325. A latch circuit controlled by a clock signal can be used in the first storage portion 321 and the second storage portion 322. Note that the structure of the storage circuit 320_(m+1) is similar to that of the storage circuit 220_(m+1) described with reference to FIG. 2A; thus, detailed description is omitted.

Note that the second storage portion 322 in the storage circuit 320_(m+1) inverts a signal supplied thereto and outputs the signal to the Q terminal; accordingly, an inverter 332 is provided in the next stage of the selection circuit 340_(m+1).

<Structural Example of Secondary Storage Circuit>

The structure of the secondary storage circuit 330_(m+1) which can be used in the semiconductor device 300 of one embodiment of the present invention will be described below.

The secondary storage circuit 330_(m+1) includes a secondary storage circuit portion 102, a switch 103, and a switch 104. The secondary storage circuit 330_(m+1) also includes a first transistor 109, a second transistor 110, a third transistor 113, and a fourth transistor 114. The secondary storage circuit 330_(m+1) also includes a first capacitor 108 and a second capacitor 107.

The secondary storage circuit 330_(m+1) stores a signal supplied to a first electrode of the first transistor 109. The secondary storage circuit 330_(m+1) supplies the stored signal to a terminal electrically connected to a second electrode of the third transistor, a first electrode of the fourth transistor, and a first electrode of the second capacitor.

A signal selected by the selection unit 325 in the storage circuit 320_(m+1) is supplied to the first electrode of the first transistor 109. The secondary storage circuit 330 supplies the stored signal to the selection circuit 340_(m+1) through the terminal electrically connected to the second electrode of the third transistor, the first electrode of the fourth transistor, and the first electrode of the second capacitor.

The first transistor 109 includes a gate electrode to which the first control signal BK is supplied, the first electrode to which a signal of the second storage circuit is supplied, and an oxide semiconductor layer in which a channel is formed.

The first capacitor 108 includes a first electrode electrically connected to a second electrode of the first transistor 109 and a second electrode to which a low power supply potential is supplied.

The second transistor 110 includes a gate electrode electrically connected to the second electrode of the first transistor 109 and a first electrode electrically connected to the second electrode of the first capacitor 108.

The third transistor 113 includes a first electrode electrically connected to a second electrode of the second transistor 110 and a gate electrode to which the second control signal PR is supplied.

The fourth transistor 114 includes the first electrode electrically connected to the second electrode of the third transistor 113, a gate electrode electrically connected to the gate electrode of the third transistor 113, and a second electrode to which a high power supply potential is supplied.

The second capacitor 107 includes the first electrode electrically connected to the first electrode of the fourth transistor 114 and a second electrode electrically connected to the first electrode of the second transistor 110.

Note that this embodiment can be combined with any of the other embodiments in this specification as appropriate.

Embodiment 3

A storage circuit which retains written data even after the supply of a power supply voltage is stopped can be used as a secondary storage circuit of the semiconductor device 300 of one embodiment of the present invention.

The semiconductor device 300 of one embodiment of the present invention in which a secondary storage circuit which retains written data even after the supply of a power supply voltage is stopped is used can restart the operation based on data stored before the supply of the power supply voltage is stopped, by supplying the power supply voltage again even when the supply of a power supply voltage is stopped after the supply of the power supply voltage. Therefore, a semiconductor device in which power consumed in retaining data when the supply of the power supply voltage is stopped is low can be provided.

In this embodiment, a driving method of the secondary storage circuit 330_(m+1) which can be used in the semiconductor device 300 of one embodiment of the present invention and which retains data even after the supply of a power supply voltage is stopped will be described with reference to a timing diagram shown in FIG. 5.

Figure 5:
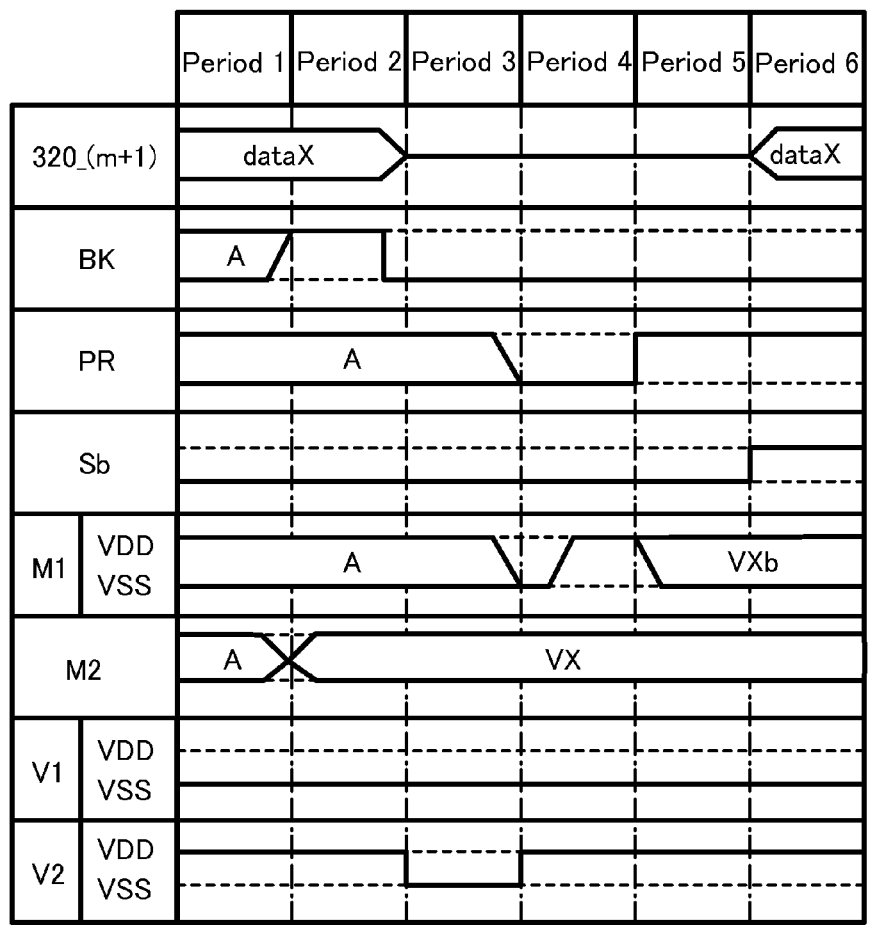
FIG. 5 is a timing diagram showing a secondary storage circuit of an embodiment.

In the timing chart in FIG. 5, reference numeral 320_(m+1) denotes data held in the storage circuit 320_(m+1), reference symbol BK denotes the potential of the first control signal BK, reference symbol PR denotes the potential of the second control signal PR, reference symbol Sb denotes the potential of the second selection signal Sb, reference symbol V1 denotes a potential V1, and reference symbol V2 denotes a potential V2. When a potential difference V between the potential V1 and the potential V2 is 0, the power supply voltage is not supplied. Reference symbol M1 denotes the potential of the node M1, and reference symbol M2 denotes the potential of the node M2.

In the driving method below, an example will be described in which, in the case of using an n-channel transistor for the switch 103 and a p-channel transistor for the switch 104 in the structure illustrated in FIG. 4, the first terminal and the second terminal of the switch 103 are brought into conduction and the first terminal and the second terminal of the switch 104 are brought out of conduction when the second control signal PR has a high-level potential, and the first terminal and the second terminal of the switch 103 are brought out of conduction and the first terminal and the second terminal of the switch 104 are brought into conduction when the second control signal PR has a low-level potential.

Further, in the selection circuit 340_(m+1), a signal supplied to the secondary storage circuit 330_(m+1) are selected when the second selection signal Sb has a high-level potential, and a signal supplied to the storage circuit 320_(m+1) are selected when the second selection signal Sb has a low-level potential. Furthermore, in the case of using an n-channel transistor for the transistor 109 in this example, the transistor 109 is turned on when the first control signal BK has a high-level potential and the transistor 109 is turned off when the first control signal BK has a low-level potential.

However, a driving method according to one embodiment of the present invention is not limited to this, and in the following description, the potential of each control signal can be determined so that the switch 103, the switch 104, the selection circuit 340_(*m*+1), and the transistor 109 are in the same state.

Further, in the following example, the potential V1 is a low power supply potential (hereinafter, referred to as VSS) and the potential V2 switches between a high power supply potential (hereinafter, referred to as VDD) and VSS. VSS can be set to, for example, a ground potential. Note that a driving method according to one embodiment of the present invention is not limited to this, and it is possible to employ a structure in which the potential V2 is VSS and the potential V1 switches between VDD and VSS.

<Normal Operation>

The operation in Period 1 in FIG. 5 will be described. In Period 1, the power supply voltage is supplied to the secondary storage circuit 330_(*m*+1). Here, the potential V2 is VDD. In a period during which the power supply voltage is supplied to the secondary storage circuit 330_(*m*+1), data is held in the storage circuit 320_(*m*+1) (referred to as dataX in FIG. 5). At this time, the selection signal Sb has a low-level potential so that a signal supplied to the selection circuit 340_(*m*+1) is not selected by the selection circuit 340_(*m*+1).

Note that the first terminal and the second terminal of each of the switch 103 and the switch 104 may be in either the conduction state or the non-conduction state. That is, the second control signal PR may have either a high-level potential or a low-level potential (this state is expressed with A in FIG. 5). Further, the transistor 109 may be either on or off. That is, the first control signal BK may have either a high-level potential or a low-level potential (this state is expressed with A in FIG. 5). In Period 1, the node M1 may have any potential (this state is expressed with A in FIG. 5). In Period 1, the node M2 may have any potential (this state is expressed with A in FIG. 5). The operation in Period 1 is referred to as normal operation.

(Operation Before Stop of Supply of Power Supply Voltage)

The operation in Period 2 in FIG. 5 will be described. Before the supply of the power supply voltage to the secondary storage circuit 330_(*m*+1) is stopped, the first control signal BK is set to a high-level potential so that the transistor 109 is turned on.

Thus, a signal corresponding to data held in the storage circuit 320_(*m*+1) (dataX) is input to the gate of the transistor 110 through the transistor 109. The signal input to the gate of the transistor 110 is held by the capacitor 108. In this manner, the potential of the node M2 becomes a signal potential corresponding to the data held in the storage circuit 320_(*m*+1) (this potential is expressed as VX in FIG. 5).

After that, the first control signal BK is set to a low-level potential so that the transistor 109 is turned off. Thus, a signal corresponding to the data held in the (m+1)th storage circuit 320_(*m*+1) is held in the secondary storage circuit portion 102. Also in Period 2, in accordance with the second selection signal Sb, the secondary storage circuit 330_(*m*+1) is not selected by the selection circuit 340_(*m*+1). The first terminal and the second terminal of each of the switch 103 and the switch 104 may be in either the conduction state or the non-conduction state. That is, the second control signal PR may have either a high-level potential or a low-level potential (this state is expressed with A in FIG. 5). In Period 2, the node M1 may have any potential (this state is expressed with A in FIG. 5). The operation in Period 2 is referred to as operation before the stop of supply of the power supply voltage.

<Operation of Stopping Supply of Power Supply Voltage>

The operation in Period 3 in FIG. 5 will be described. The operation before the stop of supply of the power supply voltage is performed, and then, the supply of the power supply voltage to the secondary storage circuit 330_(*m*+1) is stopped at the beginning of Period 3. The potential V2 becomes VSS. When the supply of the power supply voltage is stopped, the data held in the storage circuit 320_(*m*+1) (dataX) is erased. However, even after the supply of the power supply voltage to the secondary storage circuit 330_(*m*+1) is stopped, the signal potential (VX) corresponding to the data (dataX) held in the storage circuit 320_(*m*+1) is held in the node M2 by the capacitor 108.

Here, as the transistor 109, a transistor in which a channel is formed in an oxide semiconductor layer is used. Here, an n-channel enhancement (normally-off) transistor whose leakage current (off-state current) is extremely low is used as the transistor 109, and a ground potential (0 V) continues to be input to the gate of the transistor 109 when the supply of the power supply voltage to the secondary storage circuit 330_(*m*+1) is stopped. Consequently, even after the supply of the power supply voltage to the secondary storage circuit 330_(*m*+1) is stopped, the transistor 109 can be kept in the off state. As a result, a potential held by the capacitor 108 (the potential VX of the node M2) can be held for a long time.

In this manner, even after the supply of the power supply voltage to the secondary storage circuit 330_(*m*+1) is stopped, data (dataX) is held. Period 3 corresponds to a period during which the supply of the power supply voltage to the secondary storage circuit 330_(*m*+1) is stopped.

<Operation of Restarting Supply of Power Supply Voltage>

The operation in Period 4 in FIG. 5 will be described. After the supply of the power supply voltage to the secondary storage circuit 330_(*m*+1) is restarted and the potential V2 is set to VDD, the second control signal PR is set to a low-level potential; thus, the first terminal and the second terminal of the switch 104 are brought into conduction and the first terminal and the second terminal of the switch 103 are brought out of conduction. At this time, the first control signal BK is a low-level potential, and the transistor 109 remains off. The second selection signal Sb is a low-level potential, and thus a signal supplied by the secondary storage circuit 330_(*m*+1) is not selected by the selection circuit 340_(*m*+1).

In this manner, the potential V2 at the time of supplying the power supply voltage, i.e., VDD is input to the second terminal of the switch 103 and the first terminal of the switch 104. Therefore, the second terminal of the switch 103 and the first terminal of the switch 104 (the potential of the node M1) can be set to a constant potential (e.g., VDD) (hereinafter, this operation is referred to as pre-charge operation). The potential of the node M1 is held by the capacitor 107.

After the above pre-charge operation, in Period 5, the second control signal PR is set to a high-level potential; thus, the first terminal and the second terminal of the switch 103 are brought into conduction and the first terminal and the second terminal of the switch 104 are brought out of conduction. At this time, the first control signal BK keeps having a low-level potential, and the transistor 109 remains off. The second selection signal Sb has a low-level potential, and thus a signal supplied by the secondary storage circuit 330_(*m*+1) is not selected by the selection circuit 340_(*m*+1).

Depending on a signal held in the capacitor 108 (the potential VX of the node M2), the on state or the off state of the transistor 110 is selected, and the potential of the second terminal of the switch 103 and the first terminal of the switch 104, i.e., the potential of the node M1 is determined. In the case where the transistor 110 is on, the potential V1 (e.g., VSS) is input to the node M1. On the other hand, in the case where the transistor 110 is off, the potential of the node M1 keeps having a constant potential (e.g., VDD) which is determined by the above pre-charge operation. In this manner, depending on the on state or the off state of the transistor 110, the potential of the node M1 becomes VDD or VSS.

For example, in the case where a signal held in the storage circuit 320_($m$+1) is "1" and corresponds to a high-level signal (VDD), the potential of the node M1 becomes a low-level potential (VSS) corresponding to a signal "0". On the other hand, in the case where a signal held in the storage circuit 320_($m$+1) is "0" and corresponds to a low-level potential (VSS), the potential of the node M1 becomes a high-level potential (VDD) corresponding to a signal "1". That is, an inverted signal of a signal held in the storage circuit 320_($m$+1) is held in the node M1.

This potential is denoted as VXb in FIG. 5. That is, a signal corresponding to the data (dataX) input from the storage circuit 320_($m$+1) in Period 2 is converted into the potential of the node M1 (VXb).

After that, in Period 6, the second selection signal Sb is set to a high-level potential, so that the first terminal and the second terminal of the selection circuit 340_($m$+1) are brought into conduction. At this time, the second control signal PR keeps having a high-level potential. The first control signal BK keeps having a low-level potential, and thus the transistor 109 remains off.

Consequently, the phase of a signal corresponding to the potential of the second terminal of the switch 103 and the first terminal of the switch 104 (the potential of the node M1 (VXb)) is inverted through the inverter 332, and this inverted signal can be input to the storage circuit 320_($m$+1). In this manner, the data which has been held before the stop of supplying the power supply voltage to the secondary storage circuit 330_($m$+1) (dataX) can be held in the storage circuit 320_($m$+1) again.

The potential of the node M1 is set to a constant potential (VDD in FIG. 5) by the pre-charge operation in Period 4, and becomes the potential VXb corresponding to the data (dataX) in Period 5. Since the pre-charge operation is performed, the time required for the potential of the node M1 to be set to the constant potential VXb can be shortened. In this manner, the time required for the storage circuit 320_($m$+1) to hold original data again after the supply of the power supply voltage is restarted can be shortened.

The above is the driving method of the secondary storage circuit 330_($m$+1).

In the secondary storage circuit 330_($m$+1) which can be used to a semiconductor device of one embodiment of the present invention and the driving method thereof, in a period during which the secondary storage circuit 330_($m$+1) is not supplied with the power supply voltage, data stored in the storage circuit 320_($m$+1) can be held by the capacitor 108 which is provided in the secondary storage circuit portion 102.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when such a transistor including an oxide semiconductor is used for the transistor 109, a signal held in the capacitor 108 is held for a long time also in a period during which the power supply voltage is not supplied to the secondary storage circuit 330_($m$+1). The secondary storage circuit 330_($m$+1) can accordingly hold the stored content (data) also in a period during which the supply of the power supply voltage is stopped.

Since the switch 103 and the switch 104 are provided, secondary storage circuit 330_($m$+1) performs the above pre-charge operation; thus, the time required for the storage circuit 320_($m$+1) to hold original data again after the supply of the power supply voltage is restarted can be shortened.

In the secondary storage circuit portion 102, a signal held by the capacitor 108 is input to the gate of the transistor 110. Therefore, after the supply of the power supply voltage to the secondary storage circuit 330_($m$+1) is restarted, the signal held by the capacitor 108 can be converted into the one corresponding to the state (the on state or the off state) of the transistor 110 to be read from the secondary storage circuit portion 102. Consequently, an original signal can be accurately read even when a potential corresponding to the signal held by the capacitor 108 fluctuates to some degree.

By applying the above-described the secondary storage circuit 330_($m$+1) to a storage device such as a register or a cache memory included in a signal processing circuit, data in the storage device can be prevented from being erased owing to the stop of the supply of the power supply voltage. Further, shortly after the supply of the power supply voltage is restarted, the storage element can return to the state before the power supply is stopped. Therefore, the power supply can be stopped even for a short time in the signal processing circuit or one or a plurality of logic circuits included in the signal processing circuit. Accordingly, it is possible to provide a signal processing circuit whose power consumption can be suppressed and a driving method of the signal processing circuit whose power consumption can be suppressed.

Note that this embodiment can be combined with any of the other embodiments in this specification as appropriate.

Embodiment 4

In this embodiment, structures of a storage circuit and a secondary storage circuit which can be used in a semiconductor device of one embodiment of the present invention will be described with reference to FIG. 6, FIG. 7, and FIG. 8.

Figure 6:
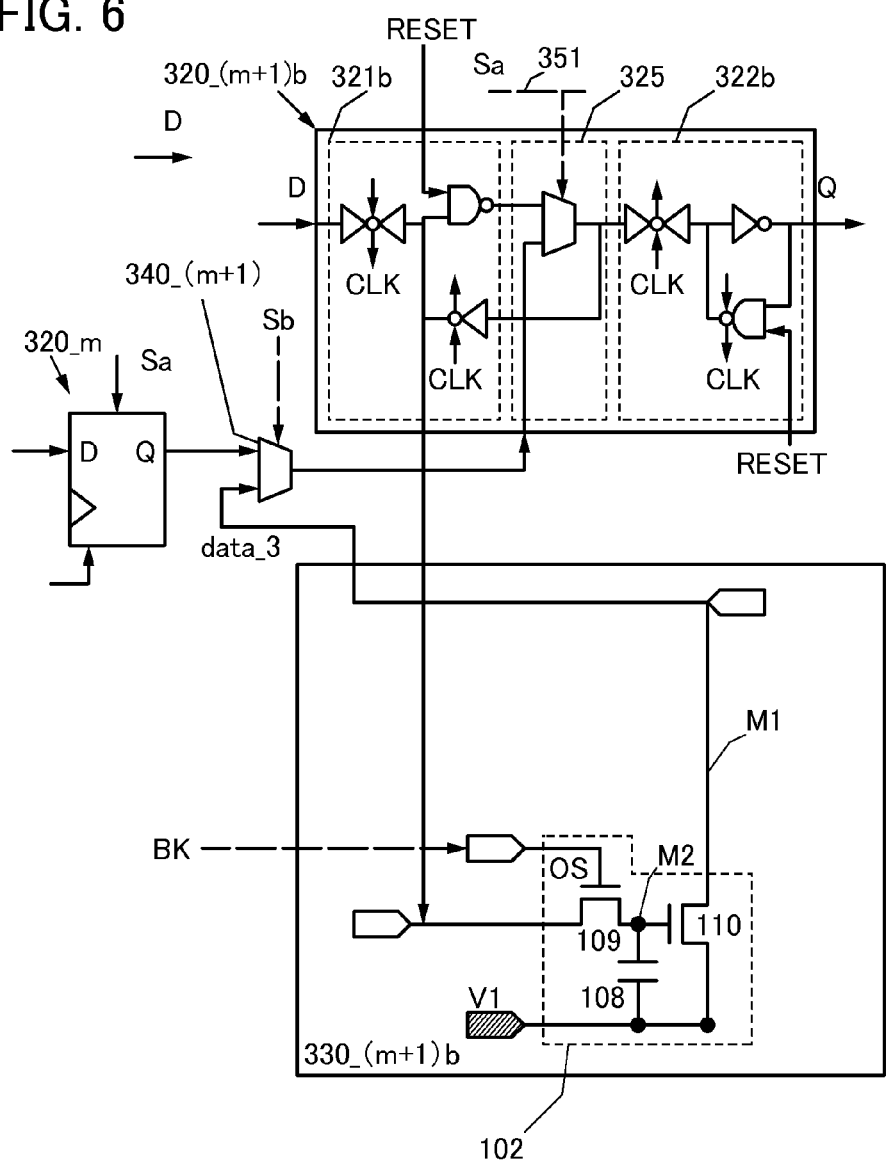
FIG. 6 is a circuit diagram illustrating the structure of a storage circuit of an embodiment.
Figure 7:
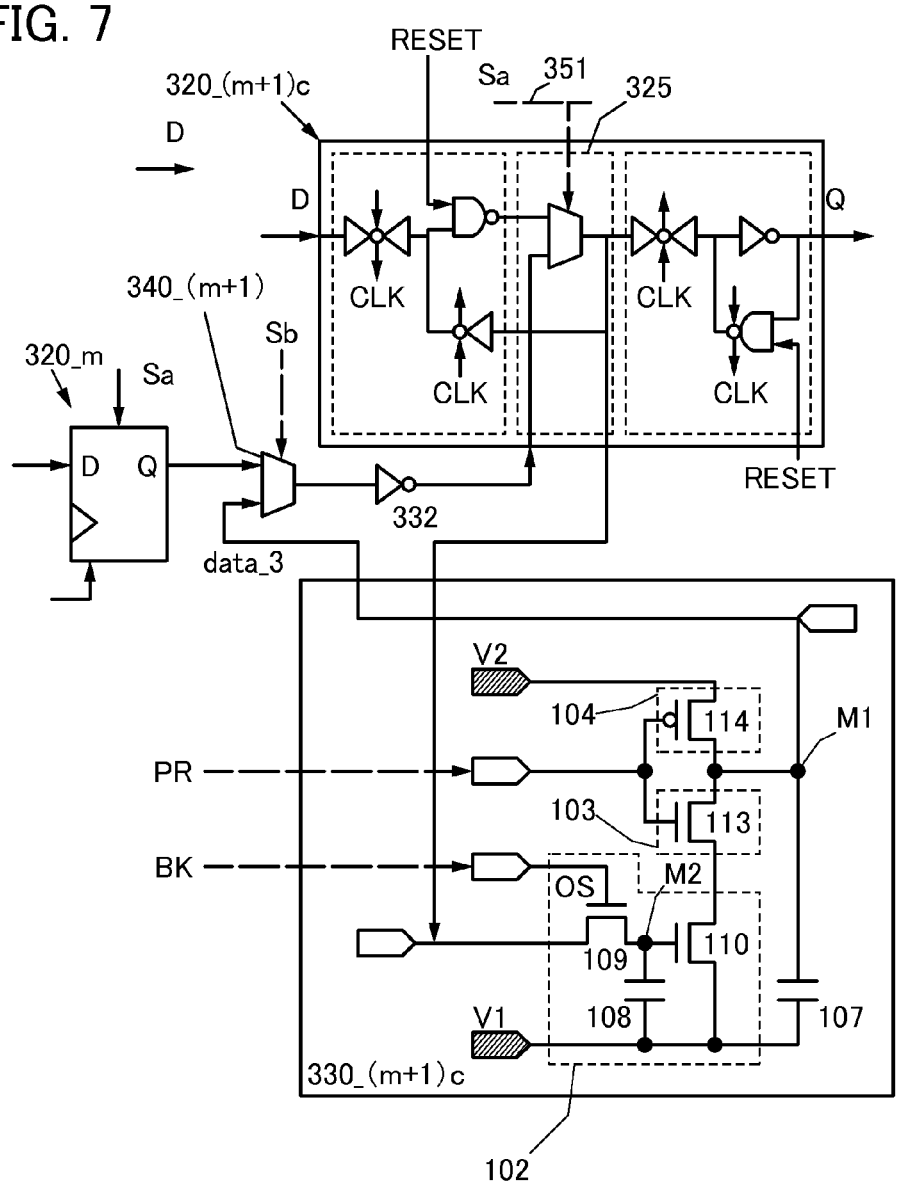
FIG. 7 is a circuit diagram illustrating the structure of a storage circuit of an embodiment.
Figure 8:
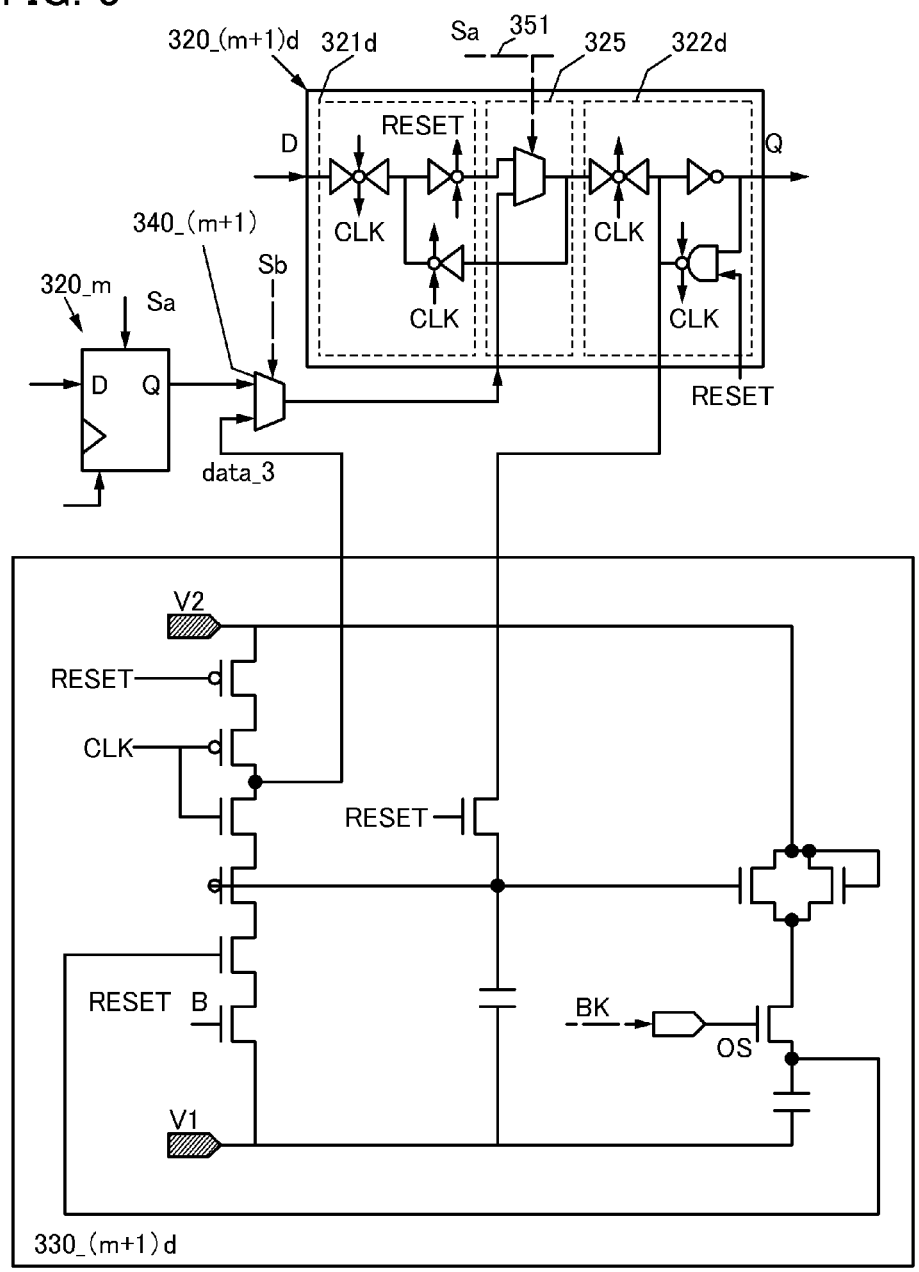
FIG. 8 is a circuit diagram illustrating the structure of a storage circuit of an embodiment.
Figure 9:
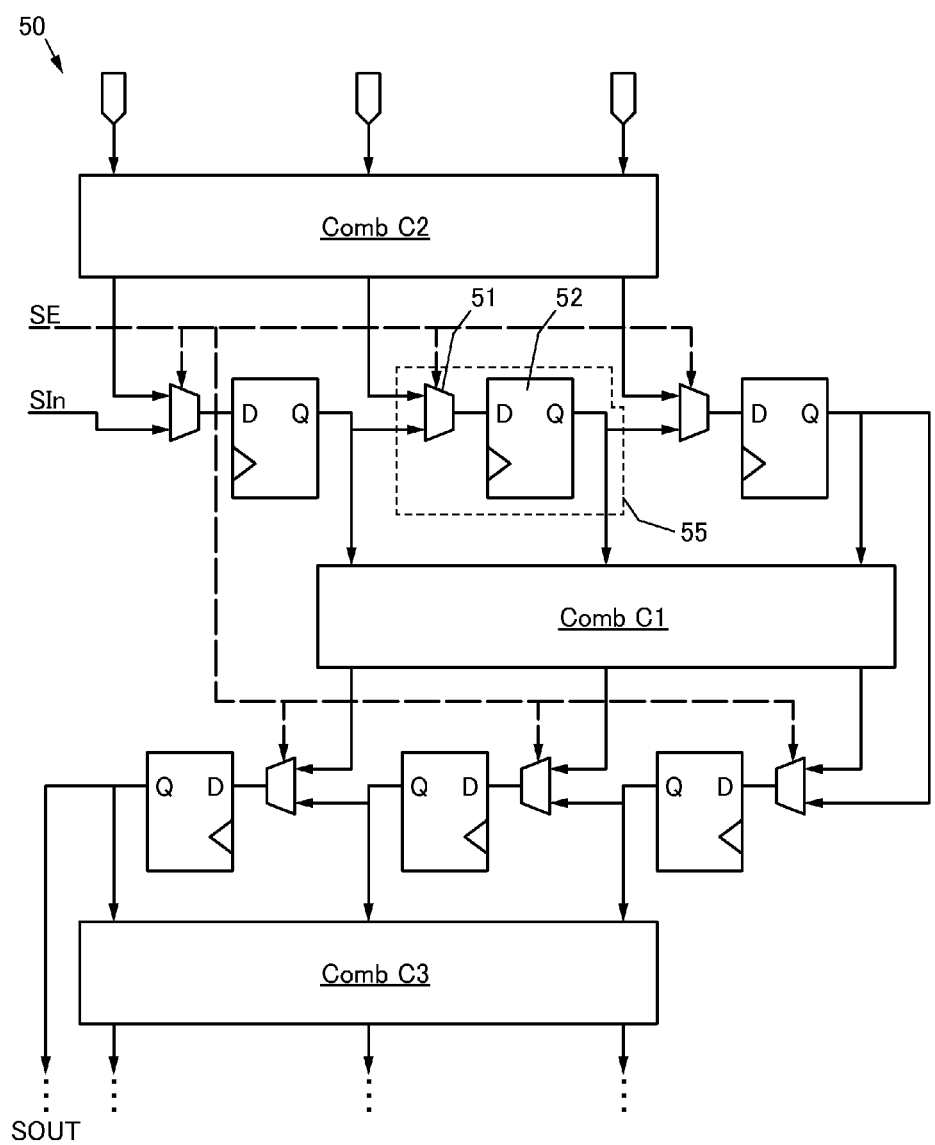
FIG. 9 illustrates the structure of a logic circuit capable of carrying out a scan test.

FIG. 6, FIG. 7, and FIG. 8 are circuit diagrams illustrating examples of the storage circuit 320_($m$+1) and the secondary storage circuit 330_($m$+1) which can be used in a semiconductor device of one embodiment of the present invention. Any of the structures can be replaced with the structures of the storage circuit and the secondary storage circuit illustrated in FIG. 4 in Embodiment 2.

Specifically, a storage circuit 320_($m$+1)b illustrated in FIG. 6 is a modification example of the storage circuit 320_($m$+1) and a secondary storage circuit 330_($m$+1)b is a modification example of the secondary storage circuit 330_($m$+1).

The storage circuit 320_($m$+1)b illustrated in FIG. 6 is different from the storage circuit 320_($m$+1) illustrated in FIG. 4 in that the inverter in the first storage portion 321 is replaced with a NAND circuit which can supply a reset signal and the clocked inverter in the second storage portion 322 is replaced with a clocked NAND circuit which can supply a reset signal. In the structure, if a reset signal is supplied to the storage circuit 320_($m$+1)b, the storage circuit 320_($m$+1)b can be reset.

After the supply of a power supply voltage is stopped, a reset signal is supplied to the storage circuit 320_($m$+1)b; then, a signal is supplied from the secondary storage circuit. As a result, the semiconductor device can be stably driven.

The storage circuit 320_($m$+1)b supplies a signal which is not inverted by the first storage portion 321$b$ to the secondary storage circuit 330_($m$+1)b from the first storage portion 321$b$. The secondary storage circuit 330_($m$+1)b supplies an inversion signal of a signal supplied from the first storage portion 321b to the selection circuit 340_(m+1). Accordingly, an inverter is not necessarily provided between the selection circuit 340_(m+1) and the storage circuit 320_(m+1)b.

A storage circuit 320_(m+1)c illustrated in FIG. 7 has the structure similar to that of the storage circuit 320_(m+1)b.

The storage circuit 320_(m+1)c supplies a signal inverted by a first storage portion 321c to a secondary storage circuit 330_(m+1)c. In the structure, like the structure illustrated in FIG. 4, an inverter is provided between the selection circuit 340_(m+1) and the storage circuit 320_(m+1)c.

A storage circuit 320_(m+1)d illustrated in FIG. 8 is different from the storage circuit 320_(m+1) illustrated in FIG. 4 in that the inverter in a first storage portion 321 is replaced with a gated inverter which can supply a reset signal as a gate signal and the clocked inverter in the second storage portion 322 is replaced with a clocked NAND circuit which can supply a reset signal. In the structure, if a reset signal is supplied to the storage circuit 320_(m+1)d, the storage circuit 320_(m+1)d can be reset.

A secondary storage circuit 330_(m+1)d illustrated in FIG. 8 has a structure different from that of the secondary storage circuit 330_(m+1) illustrated in FIG. 4.

Note that this embodiment can be combined with any of the other embodiments in this specification as appropriate.

Embodiment 5

In this embodiment, the structure of a storage circuit which can be used in a semiconductor device of one embodiment of the present invention will be described with reference to FIG. 10.

Figure 10:
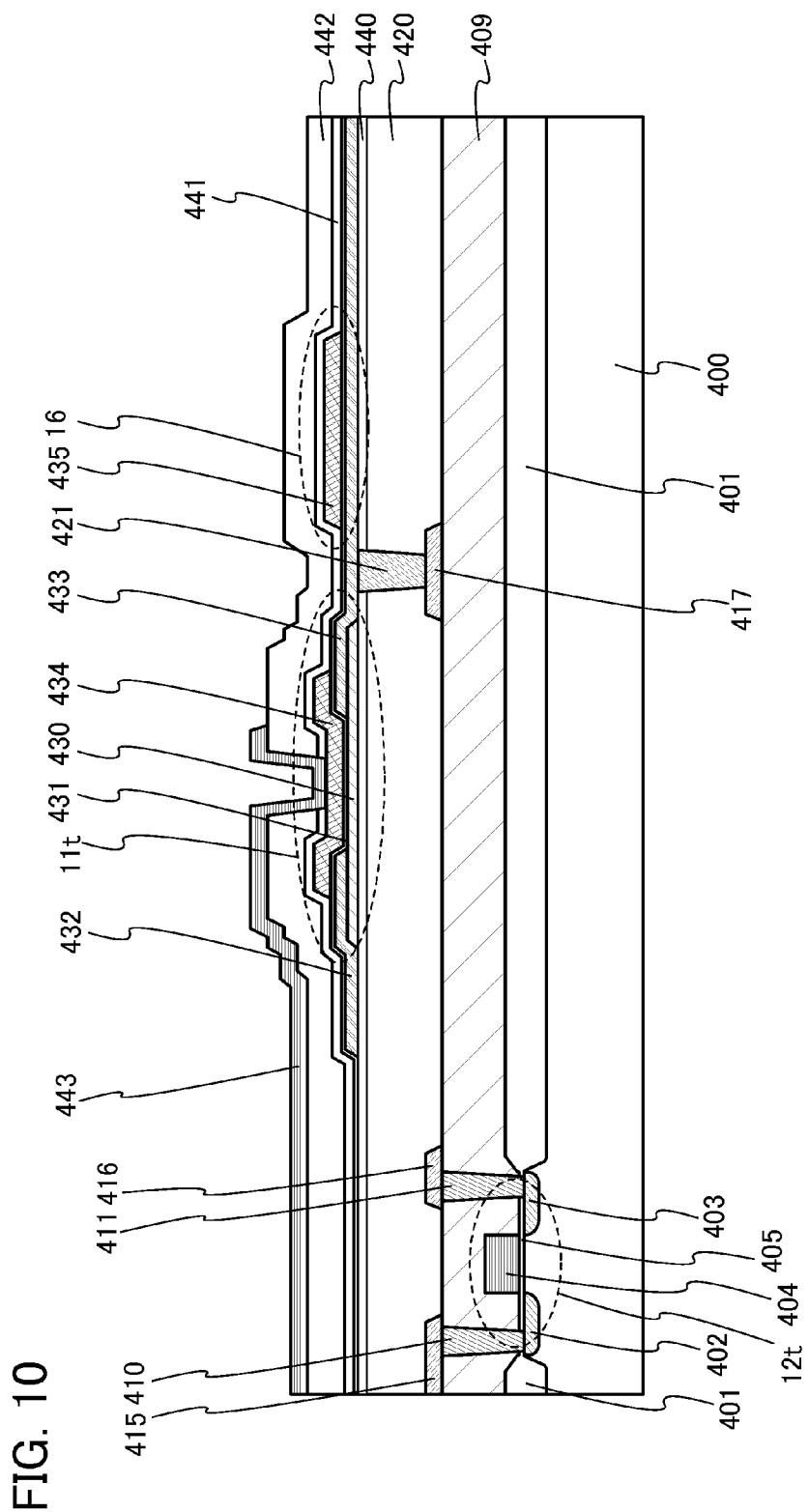
FIG. 10 illustrates a cross-sectional structure of a storage circuit.

FIG. 10 illustrates a cross sectional structure of a transistor 11t, a transistor 12t, and a capacitor 16.

In the case of using the structure in the secondary storage circuit 330_(m+1) illustrated in FIG. 4, the structure of the transistor 11t, the structure of the transistor 12t, and the structure of the capacitor 16 can be used for the transistor 109, the transistor 110, and the capacitor 108, respectively.

In this embodiment, the case where the transistor 11t including a channel formation region in an oxide semiconductor film and the capacitor 16 are formed over the transistor 12t including a channel formation region in a single crystal silicon substrate is shown as an example.

Note that an active layer in the transistor 12t can be an amorphous, microcrystalline, polycrystalline, or signal crystal semiconductor film of silicon, germanium, or the like. Alternatively, the active layer in the transistor 12t may be formed using an oxide semiconductor. In the case where the transistors each include an oxide semiconductor in an active layer, the transistor 11t is not necessarily stacked above the transistor 12t, and the transistors 11t and 12t may be formed in one layer.

In the case where the transistor 12t is formed using a silicon thin film, any of the following can be used, for example: amorphous silicon formed by sputtering or vapor deposition such as plasma CVD, polycrystalline silicon obtained by crystallization of amorphous silicon by laser annealing or the like, and single crystal silicon obtained in such a manner that a surface portion of a single crystal silicon wafer is separated after implantation of hydrogen ions or the like into the silicon wafer.

Examples of a semiconductor substrate 400 in which the transistor 12t is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). FIG. 10 illustrates an example in which a single crystal silicon substrate having n-type conductivity is used.

The transistor 12t is electrically isolated from other transistors by an element isolation insulating film 401. For formation of the element isolation insulating film 401, a selective oxidation method (local oxidation of silicon (LOCOS) method), a trench isolation method, or the like can be used.

Specifically, the transistor 12t includes impurity regions 402 and 403 that are formed in the semiconductor substrate 400 and function as a source region and a drain region, a gate electrode 404, and a gate insulating film 405 provided between the semiconductor substrate 400 and the gate electrode 404. The gate electrode 404 overlaps a channel formation region formed between the impurity regions 402 and 403 with the gate insulating film 405 laid therebetween.

An insulating film 409 is provided over the transistor 12t. Openings are formed to penetrate the insulating film 409. Wirings 410 and 411 are formed in the openings and are in contact with the impurity regions 402 and 403, respectively.

The wiring 410 is electrically connected to a wiring 415 formed over the insulating film 409. The wiring 411 is electrically connected to a wiring 416 formed over the insulating film 409.

An insulating film 420 and an insulating film 440 are formed to be stacked in this order over the wirings 415 to 417. An opening is formed in the insulating films 420 and 440. A wiring 421 electrically connected to the wiring 417 is formed in the opening.

The transistor 11t and the capacitor 16 are formed over the insulating film 440.

The transistor 11t includes, over the insulating film 440, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that is positioned over the gate insulating film 431 and overlaps with the semiconductor film 430 between the conductive films 432 and 433. Note that the conductive film 433 is electrically connected to the wiring 421.

A conductive film 435 is provided over the gate insulating film 431 to overlap the conductive film 433. A portion in which the conductive film 435 overlaps with the conductive film 433 with the gate insulating film 431 placed therebetween functions as the capacitor 16.

Note that the case where the capacitor 16, together with the transistor 11t, is provided over the insulating film 440 is illustrated in FIG. 10 as an example; alternatively, the capacitor 16 may be provided below the insulating film 440 along with the transistor 12t.

An insulating film 441 and an insulating film 442 are formed to be stacked in this order over the transistor 11t and the capacitor 16. An opening is formed in the insulating films 441 and 442. A conductive film 443 that is in contact with the gate electrode 434 in the opening is provided over the insulating film 441.

In FIG. 10, the transistor 11t includes the gate electrode 434 on at least one side of the semiconductor film 430. Alternatively, the transistor 11t may include a pair of gate electrodes with the semiconductor film 430 placed therebetween.

In the case where the transistor 11t has a pair of gate electrodes with the semiconductor film 430 therebetween, one of the gate electrodes may be supplied with a signal for controlling the on/off state of the transistor 11t, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 10, the transistor 11t has a single-gate structure in which one channel formation region corresponding to one gate electrode 434 is provided. However, the transistor 11t may have a multi-gate structure in which a plurality of gate electrodes electrically connected to each other are provided and thus a plurality of channel formation regions are included in one active layer.

Note that this embodiment can be combined with any of the other embodiments in this specification as appropriate.

Embodiment 6

In this embodiment, an oxide semiconductor film which can be used for a semiconductor device of one embodiment of the present invention will be described.

A purified oxide semiconductor (purified OS) obtained by reduction of impurities such as moisture or hydrogen which serves as an electron donor (donor) and by reduction of oxygen defects is an intrinsic (i-type) semiconductor or a substantially i-type semiconductor. For this reason, a transistor having a channel formation region in a highly purified oxide semiconductor film has extremely small off-state current and high reliability.

Specifically, various experiments can prove low off-state current of a transistor including a channel formation region in a highly purified oxide semiconductor film. For example, even when an element has a channel width of $1\times10^6$ μm and a channel length of 10 μm, off-state current can be lower than or equal to the measurement limit of a semiconductor parameter analyzer, i.e., lower than or equal to $1\times10^{-13}$ A, at a voltage (drain voltage) between a source electrode and a drain electrode of 1 V to 10 V. In that case, it can be seen that off-state current normalized on the channel width of the transistor is lower than or equal to 100 zA/μm. In addition, a capacitor and a transistor were connected to each other and off-state current was measured using a circuit in which electric charge flowing to or from the capacitor is controlled by the transistor. In the measurement, a highly purified oxide semiconductor film was used for the channel formation region of the transistor, and the off-state current of the transistor was measured from a change in the amount of electric charge of the capacitor per unit hour. As a result, it was found that, in the case where the voltage between the source electrode and the drain electrode of the transistor is 3 V, a lower off-state current of several tens of yoctoamperes per micrometer is obtained. Accordingly, the transistor using the highly purified oxide semiconductor film for the channel formation region has much lower off-state current than a crystalline silicon transistor.

Unless otherwise specified, in the case of an n-channel transistor, the off-state current in this specification is a current that flows between a source and a drain when the potential of a gate is lower than or equal to 0 with the potential of the source as a reference potential while the potential of the drain is higher than those of the source and the gate. Meanwhile, in the case of a p-channel transistor, the off-state current in this specification is a current that flows between a source and a drain when the potential of a gate is higher than or equal to 0 with the potential of the source as a reference potential while the potential of the drain is lower than those of the source and the gate.

In the case where an oxide semiconductor film is used as the semiconductor film, at least indium (In) or zinc (Zn) is preferably included as an oxide semiconductor. The oxide semiconductor preferably contains, in addition to In and Zn, gallium (Ga) serving as a stabilizer that reduces variations in electrical characteristics among transistors using the above-described oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, the In—Ga—Zn-based oxide allows a transistor with favorable electrical characteristics to be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn, and there is no limitation on the ratio of In, Ga, and Zn. In addition, the In—Ga—Zn—O-based oxide may contain a metal element other than In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with an In—Sn—Zn-based oxide, high mobility can be realized relatively easily. However, even with an In—Ga—Zn-based oxide, mobility can be increased by reducing the defect density in the bulk.

The oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as CAAC-OS (c-axis aligned crystalline oxide semiconductor).

For example, the oxide semiconductor film may include a CAAC-OS. In the CAAC-OS, for example, c-axes are aligned, and a-axes and/or b-axes are not macroscopically aligned.

For example, the oxide semiconductor film may include microcrystal. Note that an oxide semiconductor including microcrystal is referred to as microcrystalline oxide semiconductor. A microcrystalline oxide semiconductor film includes, for example, an oxide semiconductor including microcrystal with a size greater than or equal to 1 nm and less than 10 nm.

For example, the oxide semiconductor film may include an amorphous part. Note that an oxide semiconductor including an amorphous part is referred to as amorphous oxide semiconductor. An amorphous oxide semiconductor film), for example, has disordered atomic arrangement and no crystalline component. Alternatively, an amorphous oxide semiconductor film contains, for example, an oxide semiconductor which is absolutely amorphous and has no crystal part.

Note that the oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that the oxide semiconductor film may be in a single-crystal state, for example.

It is preferable that the oxide semiconductor film include a plurality of crystal parts, and in each of the crystal parts, a c-axis be aligned in a direction parallel to a normal vector of a surface in which the oxide semiconductor film is formed or a normal vector of a surface of the oxide semiconductor film. Note that among crystal parts, the directions of the a-axis and the b-axis of one crystal part may be different from those of another crystal part. An example of such an oxide semiconductor film is a CAAC-OS film.

The CAAC-OS film is neither absolutely single crystal (i.e., it is a type of non-single crystal) nor absolutely amorphous. Note that in most cases, the crystal part fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, the c-axis is aligned in a direction parallel to a normal vector of a surface in which the CAAC-OS film is formed or a normal vector of a surface of the CAAC-OS film. Note that among crystal parts, the directions of the a-axis and the b-axis of one crystal part may be different from those of another crystal part. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from the surface side of the oxide semiconductor film, the proportion of crystal parts in the vicinity of the surface of the oxide semiconductor film is sometimes higher than that in the vicinity of the surface in which the oxide semiconductor film is formed. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface in which the CAAC-OS film is formed or a normal vector of a surface of the CAAC-OS film, the directions of the c-axes may be different from each other depending on the shape of the CAAC-OS film (the cross-sectional shape of the surface in which the CAAC-OS film is formed or the cross-sectional shape of the surface of the CAAC-OS film). Note that the c-axes of the crystal parts are aligned in the direction parallel to a normal vector of the surface in which the CAAC-OS film is formed or a normal vector of the surface of the CAAC-OS film. The crystal part is formed by film formation or by performing treatment for crystallization such as heat treatment after film formation.

In a transistor including the CAAC-OS film, a change in electrical characteristics due to irradiation with visible light or ultraviolet light is small. Thus, the transistor has high reliability.

For example, the CAAC-OS film is formed by a sputtering method with a polycrystalline metal oxide sputtering target. By collision of ions with the target, a crystal region included in the target may be separated from the target along an a-b plane; in other words, a sputtered particle having a plane parallel to an a-b plane (flat-plate-like sputtered particle or pellet-like sputtered particle) may flake off from the target. In that case, the flat-plate-like sputtered particle reaches a substrate while maintaining their crystal state, by which the CAAC-OS film can be formed.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

As an example of the target, an In—Ga—Zn-based target is described below.

The In—Ga—Zn-based oxide target, which is polycrystalline, is made as follows: $InO_X$ powder, $GaO_Y$ powder, and $ZnO_Z$ powder are mixed in a predetermined molar ratio, pressure is applied to the mixture, and heat treatment is performed at a temperature from 1000° C. to 1500° C. Note that X, Y, and Z are given positive numbers. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired target.

An alkali metal is not an element included in an oxide semiconductor and thus is an impurity. Also, alkaline earth metal is an impurity in the case where the alkaline earth metal is not a component of the oxide semiconductor. Alkali metal, in particular, Na becomes Na+ when an insulating film in contact with the oxide semiconductor film is an oxide and Na diffuses into the insulating film. Further, in the oxide semiconductor film, Na cuts or enters a bond between metal and oxygen which are included in the oxide semiconductor. As a result, for example, degradation of electrical characteristics of a transistor, such as a normally-on state of the transistor due to shift of the threshold voltage in the negative direction or reduction in mobility, occurs. In addition, variations in electrical characteristics also occurs. Specifically, the Na concentration according to secondary ion mass spectrometry is reduced to preferably less than or equal to $5 \times 10^{16}/cm^3$, further preferably less than or equal to $1 \times 10^{16}/cm^3$, still further preferably less than or equal to $1 \times 10^{15}/cm^3$. In a similar manner, the measurement value of Li concentration is preferably less than or equal to $5 \times 10^{15}/cm^3$, more preferably less than or equal to $1 \times 10^{15}/cm^3$. In a similar manner, the measurement value of K concentration is preferably less than or equal to $5 \times 10^{15}/cm^3$, more preferably less than or equal to $1 \times 10^{15}/cm^3$.

Thus, in the case where a metal oxide containing indium is used, the bond between indium and oxygen can be prevented from being cut by silicon or carbon having a higher ability than indium to bind to oxygen, so that oxygen vacancies are formed in some cases. Therefore, in the case where the oxide semiconductor film contains silicon or carbon, degradation in electrical characteristics of a transistor occurs easily, like the case of containing alkali metal or alkali earth metal. Thus, the concentration of silicon or carbon in the oxide semiconductor film is preferably low. Specifically, the concentration of carbon or silicon measured by secondary ion mass spectrometry is preferably $1 \times 10^{18}/cm^3$ or lower. In the structure, degradation in the electrical characteristics of the transistor can be prevented, and thus, the reliability of PLD (programmable logic device) or a semiconductor device can be improved.

Depending on a conductive material used for a source electrode and a drain electrode, metal in the source electrode and the drain electrode extracts oxygen from the oxide semiconductor film. In such a case, by formation of oxygen vacancies, part of the oxide semiconductor film which is in contact with the source electrode and the drain electrode becomes n-type.

The n-type region serves as a source region or a drain region, resulting in a decrease in the contract resistances between the semiconductor film and a source electrode and between the semiconductor film and a drain electrode. Accordingly, the formation of the n-type region increases the mobility and on-state current of the transistor, which achieves high-speed operation of a switch circuit using the transistor.

Note that the extraction of oxygen by a metal in the source electrode and the drain electrode is probably caused when the source electrode and the drain electrode are formed by a sputtering method or when heat treatment is performed after the formation of the source electrode and the drain electrode.

The n-type region is more likely to be formed by forming the source electrode and the drain electrode with use of a conductive material which is easily bonded to oxygen. Examples of such a conductive material include Al, Cr, Cu, Ta, Ti, Mo, and W.

The oxide semiconductor film is not limited to a single-layer metal oxide semiconductor film and may have a layered structure of a plurality of metal oxide semiconductor films. The first to third metal oxide films are each an oxide film which contains at least one of the metal elements contained in the second metal oxide film and whose energy at a bottom of conduction band is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order that the carrier mobility is high.

In the transistor having the above semiconductor film, when a voltage is applied to a gate electrode so that an electric field is applied to the semiconductor film, a channel region is formed in the second metal oxide film whose minimum energy of the conduction band is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, carriers are not easily inhibited from moving at the interface, which results in an increase in the field-effect mobility of the transistor.

Further, when an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold voltage.

Further, it is preferable that a plurality of oxide semiconductor films be stacked so that an interface level due to an impurity existing between the metal oxide films, which inhibits carrier flow, is not formed at the interface between the oxide semiconductor films. This is because when an impurity exists between the stacked metal oxide films, the continuity of the energy at the bottom of the conduction band between the metal oxide films is lost, and carriers are trapped or disappear by recombination in the vicinity of the interface. By reducing an impurity existing between the films, a continuous junction (here, in particular, a U-shape well structure whose energy at the bottom of the conduction band is changed continuously between the films) is formed more easily than the case of merely stacking a plurality of metal oxide films which share at least one main metal component.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to high vacuum (about $1\times10^{-4}$ Pa to $5\times10^{-7}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, a chamber needs to be subjected to high vacuum evacuation, and in addition, a sputtering gas needs to be highly purified. When a highly purified oxygen gas or argon gas having a dew point of −40° C. or lower, preferably −80° C. or lower, and more preferably −100° C. or lower is used as the sputtering gas, moisture or the like can be prevented from entering the oxide semiconductor film as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio 1.5 times or more, preferably twice or more, and more preferably three times or more that in the second metal oxide film. The above element is strongly bonded to oxygen, and thus has a function of suppressing generation of oxygen vacancies in the oxide film. That is, oxygen vacancies are less likely to be generated in, the first metal oxide film or the third metal oxide film than in the second metal oxide film.

Specifically, when both the second metal oxide film and the first or third metal oxide film include an In-M-Zn-based oxide, the atomic ratio of the first or third metal oxide film, In:M:Zn=$x_1$:$y_1$:$z_1$, and the atomic ratio of the second metal oxide film, In:M:Zn=$x_2$:$y_2$:$z_2$, may be determined so that $y_1/x_1$ is larger than $y_2/x_2$. Note that the element M is a metal element which has a higher ability than In to bind to oxygen, examples of which include Al, Ti, Ga, Y, Zr, Sn, La, Ce, Nd, and Hf. The atomic ratio is preferably determined so that $y_1/x_1$ is 1.5 or more times $y_2/x_2$. More preferably, the atomic ratio is determined so that $y_1/x_1$ is 2 or more times $y_2/x_2$. Still more preferably, the atomic ratio is determined so that $y_1/x_1$ is 3 or more times $y_2/x_2$. Further, it is preferable that $y_2$ be greater than or equal to $x_2$ in the second metal oxide film, in which case the transistor 100 can have stable electrical characteristics. Note that $y_2$ is preferably less than 3 times $x_2$ because the field-effect mobility of the transistor is lowered if $y_2$ is 3 or more times $x_2$.

The first metal oxide film and the third metal oxide film each have a thickness of 3 nm to 100 nm, preferably 3 nm to 50 nm. The second metal oxide film has a thickness of 3 nm to 200 nm, preferably 3 nm to 100 nm, and more preferably 3 nm to 50 nm.

In the three-layer semiconductor film, the first and third metal oxide films can be amorphous or crystalline. Note that the second metal oxide film in which a channel region is formed preferably has a crystalline structure, in which case the transistor can have stable electrical characteristics.

Note that a channel formation region refers to a region of a semiconductor film of a transistor, which overlaps with a gate electrode and which is between a source electrode and a drain electrode. Further, a channel region refers to a region through which current mainly flows in the channel formation region.

For example, in the case where an In—Ga—Zn-based oxide film formed by a sputtering method is used as each of the first and third metal oxide films, the first and third metal oxide films can be deposited with use of an In—Ga—Zn-based oxide target (In:Ga:Zn=1:3:2 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, in the case where the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that in the transistor, the edge of the semiconductor film may be tapered or rounded.

Even in the case of using a semiconductor film having a plurality of stacked metal oxide films for a transistor, a region that in contact with a source electrode and a drain electrode may be an n-type semiconductor region. Such a structure increases the mobility and on-state current of the transistor and achieves high-speed operation of a PLD or a semiconductor device using the transistor. Furthermore, using a semiconductor film having a plurality of stacked metal oxide films for a transistor, the n-type semiconductor region preferably reaches the second metal oxide film which is to be a channel region, in which case the mobility and on-state current of the transistor is further increased and higher-speed operation of a PLD or a semiconductor device is achieved.

Note that this embodiment can be combined with any of the other embodiments in this specification as appropriate.

Embodiment 7

In this embodiment, electronic devices each including a semiconductor device of one embodiment of the present invention will be described with reference to FIGS. 11A to 11E.

Examples of an electronic device using a semiconductor device of one embodiment of the present invention include: television sets (also called TV or television receivers); monitors for computers or the like; cameras such as digital cameras or digital video cameras; digital photo frames; mobile phones (also called cellular phones or portable telephones); portable game machines; portable information terminals; audio playback devices; and large game machines such as pachinko machines. FIGS. 11A to 11E illustrate specific examples of these electronic devices.

Figure 11A:
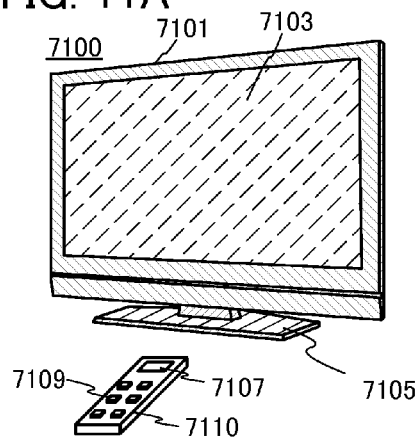
FIGS. 11A to 11E each illustrate an electronic device.

FIG. 11A illustrates an example of a television device. In the television device 7100, a display portion 7103 is incorporated in a housing 7101. Images can be displayed on the display portion 7103. In addition, here, the housing 7101 is supported by a stand 7105.

The television device 7100 can be operated by an operation switch of the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data output from the remote controller 7110.

Note that the television device 7100 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Figure 11B:
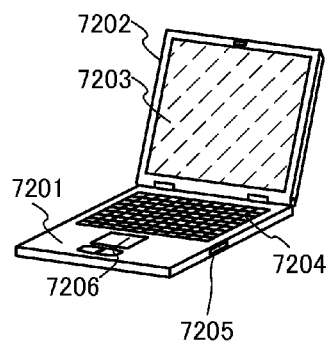

FIG. 11B illustrates a computer, which includes a main body 7201, a housing 7202, a display portion 7203, a keyboard 7204, an external connection port 7205, a pointing device 7206, and the like.

Figure 11C:
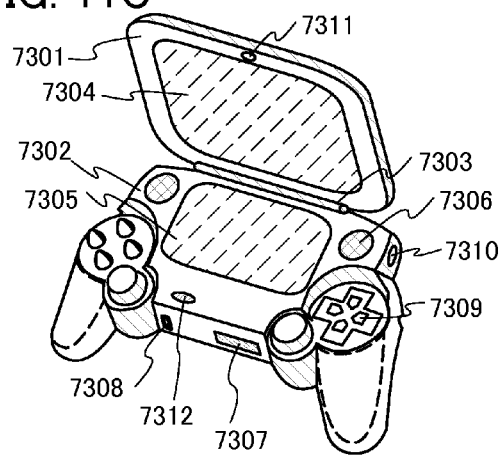

FIG. 11C illustrates a portable game machine having two housings, a housing 7301 and a housing 7302, which are connected with a joint portion 7303 so that the portable game machine can be opened or folded. A display portion 7304 is incorporated in the housing 7301 and a display portion 7305 is incorporated in the housing 7302. In addition, the portable game machine illustrated in FIG. 11C includes a speaker portion 7306, a recording medium insertion portion 7307, an LED lamp 7308, an input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 7312), and the like. The portable game machine illustrated in FIG. 11C has a function of reading a program or data stored in a recording medium to display it on the display portion, and a function of sharing information with another portable game machine by wireless communication. The portable game machine in FIG. 11C can have a variety of functions without limitation to the above functions.

Figure 11D:
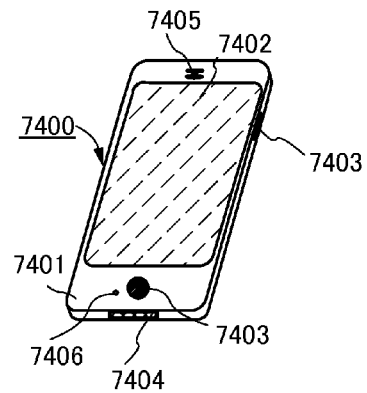

FIG. 11D illustrates an example of a mobile phone. A cellular phone 7400 is provided with a display portion 7402 incorporated in a housing 7401, an operation button 7403, an external connection port 7404, a speaker 7405, a microphone 7406, and the like.

When the display portion 7402 is touched with a finger or the like, data can be input into the mobile phone 7400 in FIG. 11D. Further, operations such as making a call and creating an e-mail can be performed by touching the display portion 7402 with a finger or the like.

There are mainly three screen modes of the display portion 7402. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, by which personal authentication can be performed. Further, by providing a backlight or a sensing light source which emits a near-infrared light in the display portion, an image of a finger vein, a palm vein, or the like can be taken.

Figure 11E:
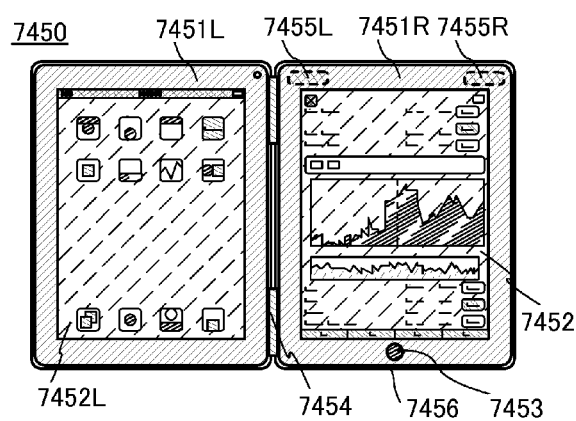

FIG. 11E illustrates an example of a folding computer. A folding computer 7450 includes a housing 7451L and a housing 7451R connected by hinges 7454. The computer 7450 further includes an operation button 7453, a left speaker 7455L, and a right speaker 7455R. In addition, a side surface of the computer 7450 is provided with an external connection port 7456, which is not illustrated. Note that when the computer 7450 is folded on the hinges 7454 so that a display portion 7452L provided in the housing 7451L and a display portion 7452R provided in the housing 7451R can face each other, the display portions can be protected by the housings.

Each of the display portions 7452L and 7452R is a component which can display images and to which data can be input by touch with a finger or the like. For example, the icon for the installed program is selected by touch with a finger, so that the program can be started. Further, changing the distance between fingers touching two positions of the displayed image enables zooming in or out on the image. Drag of a finger touching one position of the displayed image enables drag and drop of the image. Selection of the displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, when a detection device including a sensor for detecting inclination, such as a gyroscope or an acceleration sensor, is provided, the orientation of the display screen can be automatically changed by determining the orientation of the computer 7450 (whether the computer 7450 is placed horizontally or vertically).

Furthermore, the computer 7450 can be connected to a network. The computer 7450 not only can display data on the Internet but also can be used as a terminal which controls another electronic device connected to the network from a distant place.

Note that this embodiment can be combined with any of the other embodiments in this specification as appropriate.

This application is based on Japanese Patent Application serial no. 2013-010792 filed with Japan Patent Office on Jan. 24, 2013, the entire contents of which are hereby incorporated by reference.

What is claimed is:

1. A semiconductor device comprising:
    a first combination circuit;
    a first storage circuit;
    a second storage circuit;
    a selection signal line; and
    a second combination circuit;
    wherein the first storage circuit is capable of supplying a
        first data signal to the first combination circuit, wherein the second storage circuit is capable of supplying a second data signal to the first combination circuit,
wherein the selection signal line is capable of supplying a selection signal to the first storage circuit and the second storage circuit,
wherein the second combination circuit is capable of supplying the first data signal to the first storage circuit,
wherein the second combination circuit is capable of supplying the second data signal to the second storage circuit, and
wherein the second storage circuit has a function of selecting a first state in which a signal supplied from the second combination circuit is selected and a second state in which a signal supplied from the first storage circuit is selected, in accordance with the selection signal.

2. The semiconductor device according to claim 1,
wherein the second storage circuit comprises a first storage portion, a selection unit, and a second storage portion,
wherein the second data signal is supplied from the second combination circuit to the first storage portion,
wherein the selection signal is supplied from the selection signal line to the selection unit,
wherein the first data signal is supplied from the first storage circuit to the selection unit,
wherein the second data signal is supplied from the first storage portion to the selection unit,
wherein the selection unit selects the second data signal in the first state and selects the first data signal in the second state,
wherein one of the first data signal and the second data signal, which is selected by the selection unit is supplied to the second storage portion, and
wherein the second storage portion supplies the one of the first data signal and the second data signal to the first combination circuit.

3. The semiconductor device according to claim 2, wherein the first storage portion comprises a transmission gate, an inverter, and a clocked inverter.

4. The semiconductor device according to claim 2, wherein the selection unit is a multiplexer.

5. A semiconductor device comprising:
a first combination circuit;
a first storage circuit;
a second storage circuit;
a first selection signal line;
a selection circuit;
a secondary storage circuit;
a second selection signal line; and
a second combination circuit;
wherein the first storage circuit is capable of supplying a first data signal to the first combination circuit,
wherein the second storage circuit is capable of supplying a second data signal to the first combination circuit,
wherein the first selection signal line is capable of supplying a first selection signal to the first storage circuit and the second storage circuit,
wherein the selection circuit is capable of selecting a signal supplied to the second storage circuit,
wherein the secondary storage circuit is capable of supplying a third data signal to the selection circuit,
wherein the second selection signal line is capable of supplying a second selection signal for controlling the selection circuit,
wherein the second combination circuit is capable of supplying the first data signal to the first storage circuit,
wherein the second combination circuit is capable of supplying the second data signal to the second storage circuit,
wherein the second storage circuit has a function of selecting a first state in which a signal supplied from the second combination circuit is selected and a second state in which a signal supplied from the first storage circuit is selected, in accordance with the first selection signal, and
wherein the selection circuit has a function of selecting a state in which a signal which the secondary storage circuit supplies is supplied and a state in which a signal the first storage circuit supplies is supplied, in accordance with the second selection signal.

6. The semiconductor device according to claim 5,
wherein the second storage circuit comprises a first storage portion, a selection unit, and a second storage portion,
wherein the second data signal is supplied from the second combination circuit to the first storage portion,
wherein the first selection signal is supplied from the first selection signal line to the selection unit,
wherein a signal selected by the selection circuit is supplied from the selection circuit to the selection unit,
wherein the second data signal is supplied from the first storage portion to the selection unit,
wherein the selection unit selects the second data signal in the first state and selects the signal selected by the selection circuit in the second state,
wherein a signal selected by the selection unit is supplied to the second storage portion, and
wherein the second storage portion supplies the signal selected by the selection unit to the first combination circuit.

7. The semiconductor device according to claim 6, wherein the secondary storage circuit has a function of storing a signal supplied to the second storage circuit.

8. The semiconductor device according to claim 6, wherein the secondary storage circuit comprises:
a first transistor comprising a gate electrode to which a first control signal is supplied, a first electrode to which a signal of the second storage circuit is supplied, and an oxide semiconductor layer in which a channel is formed;
a first capacitor comprising a first electrode electrically connected to a second electrode of the first transistor and a second electrode to which a low power supply potential is supplied;
a second transistor comprising a gate electrode electrically connected to the second electrode of the first transistor and a first electrode electrically connected to the second electrode of the first capacitor;
a third transistor comprising a first electrode electrically connected to a second electrode of the second transistor and a gate electrode to which a second control signal is supplied;
a fourth transistor comprising a first electrode electrically connected to a second electrode of the third transistor, a gate electrode electrically connected to the gate electrode of the third transistor, and a second electrode to which a high power supply potential is supplied;
a second capacitor comprising a first electrode electrically connected to the first electrode of the fourth transistor and a second electrode electrically connected to the first electrode of the second transistor; and
a signal terminal electrically connected to the first electrode of the second capacitor.

9. The semiconductor device according to claim 6, wherein the secondary storage circuit comprises:

a first transistor comprising a gate electrode to which a first control signal is supplied, a first electrode electrically connected to the second storage circuit, a second electrode and a channel comprising an oxide semiconductor layer;

a first capacitor comprising a first electrode electrically connected to the second electrode of the first transistor and a second electrode;

a second transistor comprising a gate electrode electrically connected to the second electrode of the first transistor, a first electrode electrically connected to the second electrode of the first capacitor, and a second electrode;

a third transistor comprising a first electrode electrically connected to the second electrode of the second transistor, a gate electrode to which a second control signal is supplied, and a second electrode;

a fourth transistor comprising a first electrode electrically connected to the second electrode of the third transistor, a gate electrode electrically connected to the gate electrode of the third transistor, and a second electrode;

a second capacitor comprising a first electrode electrically connected to the first electrode of the fourth transistor and a second electrode electrically connected to the first electrode of the second transistor; and a signal terminal electrically connected to the first electrode of the second capacitor.

10. A semiconductor device comprising:
a first combination circuit;
a first storage circuit;
a second storage circuit;
a selection signal line; and
a second combination circuit;
wherein the first storage circuit is capable of supplying a first data signal to the first combination circuit,
wherein the second storage circuit is capable of supplying a second data signal to the first combination circuit,
wherein the selection signal line is capable of supplying a selection signal to the first storage circuit and the second storage circuit,
wherein the second combination circuit is capable of supplying the first data signal to the first storage circuit,
wherein the second combination circuit is capable of supplying the second data signal to the second storage circuit,
wherein the second storage circuit has a function of selecting a first state in which a signal supplied from the second combination circuit is selected and a second state in which a signal supplied from the first storage circuit is selected, in accordance with the selection signal,
wherein the second storage circuit comprises a first storage portion, a selection unit, and a second storage portion,
wherein the second data signal is supplied from the second combination circuit to the first storage portion,
wherein the selection signal is supplied from the selection signal line to the selection unit,
wherein the first data signal is supplied from the first storage circuit to the selection unit, and
wherein the second data signal is supplied from the first storage portion to the selection unit.

11. The semiconductor device according to claim 10, wherein the first storage portion comprises a transmission gate, an inverter, and a clocked inverter.

12. The semiconductor device according to claim 10, wherein the selection unit is a multiplexer.

13. A display device comprising the semiconductor device according to claim 1.

14. A display device comprising the semiconductor device according to claim 5.

15. A display device comprising the semiconductor device according to claim 10.

* * * * *